(12) United States Patent
Kanda et al.

(10) Patent No.: US 6,522,583 B2
(45) Date of Patent: Feb. 18, 2003

(54) NONVOLATILE SEMICONDUCTOR MEMORY

(75) Inventors: Kazushige Kanda, Kawasaki (JP); Hiroshi Nakamura, Fujisawa (JP); Koji Hosono, Yokohama (JP); Tamio Ikehashi, Kamakura (JP); Kenichi Imamiya, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 74 days.

(21) Appl. No.: 09/860,613

(22) Filed: May 21, 2001

(65) Prior Publication Data

US 2002/0003722 A1 Jan. 10, 2002

(30) Foreign Application Priority Data

May 22, 2000 (JP) ........................................ 2000-150256

(51) Int. Cl.[7] .............................................. G11C 16/04
(52) U.S. Cl. .............. 365/185.17; 365/195; 365/185.18
(58) Field of Search ....................... 365/185.17, 185.02, 365/185.18, 185.24, 195

(56) References Cited

U.S. PATENT DOCUMENTS 6,011,287 A * 1/2000 Itoh et al. ............... 365/185.17
6,147,911 A * 11/2000 Takeuchi et al. ........ 365/185.28

FOREIGN PATENT DOCUMENTS

| JP | 09-106686 | 4/1997 |
| JP | 10-223866 | 8/1998 |
| JP | 10-275481 | 10/1998 |
| JP | 11-185488 | 7/1999 |

* cited by examiner

Primary Examiner—Vu A. Le
(74) Attorney, Agent, or Firm—Banner & Witcoff, Ltd.

(57) ABSTRACT

A drain-side select gate line is set to VSG1 (>VDD) capable of sufficiently transferring VDD (time t1). Since all word lines in the selected block are set to Vread, VDD is applied to the channels of all memory cells in the cell units. After this, the drain-side select gate line is set to VSG2, and a program potential Vpgm is applied to the selected word line (times t2 to t3). Since VSG2 is sufficiently low, all drain-side select gate transistors are kept off, and the channel potentials of memory cells in all cell units are boosted. After this, since the drain-side select gate line is set to VSG3, the channel of the selected memory cell is set to 0V (time t4).

41 Claims, 9 Drawing Sheets

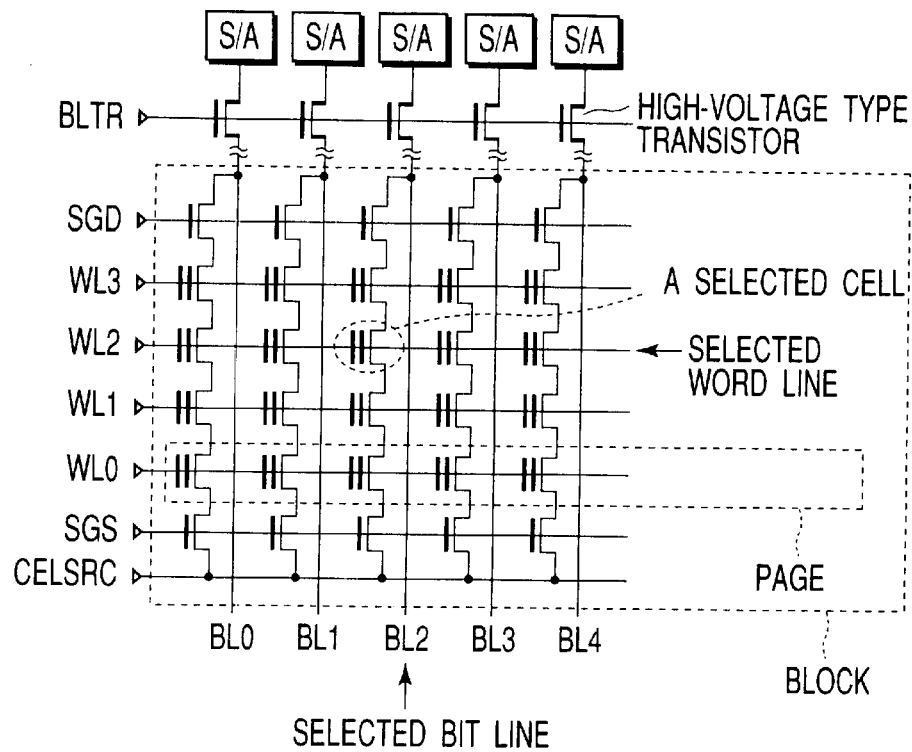
F I G. 7
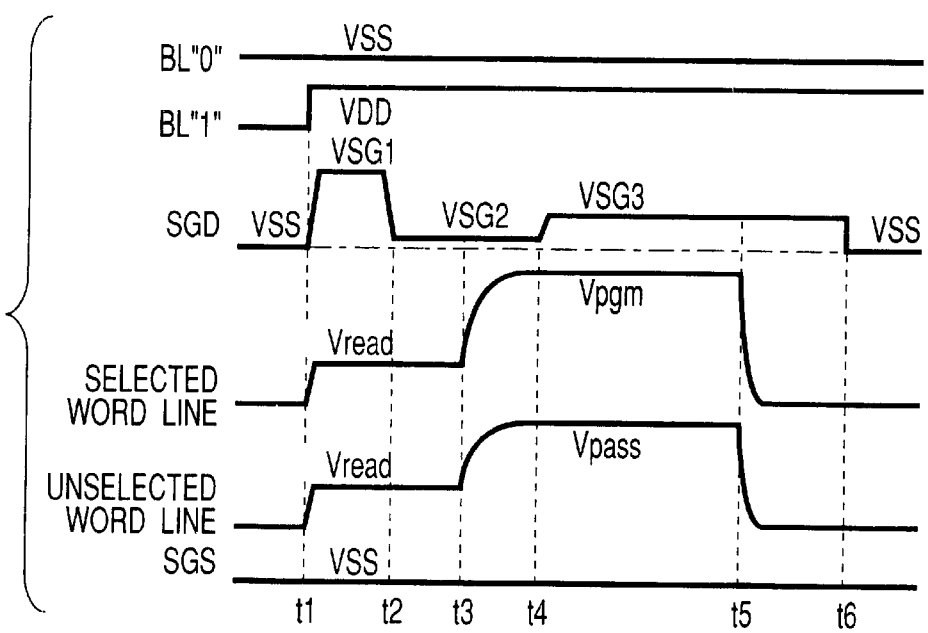
F I G. 8

NONVOLATILE SEMICONDUCTOR MEMORY

CROSS-REFERENCE TO RELATED APPLICATION

This application is based upon and claims the benefit of priority from the prior Japanese Patent Application No. 2000-150256, filed May 22, 2000, the entire contents of which are incorporated herein by reference.

BACKGROUND OF THE INVENTION

The present invention relates to the write operation of a nonvolatile semiconductor memory and, more particularly, to a nonvolatile semiconductor memory represented by a NAND flash memory, which has a cell unit formed from a memory cell and select gate transistor.

FIG. 1 is a block diagram showing main part of a conventional NAND flash memory.

A memory cell array 11 has a plurality of cell units laid out in an array. Each cell unit is formed from a NAND array including a plurality of memory cells connected in series and two select gate transistors respectively connected to the two terminals of the NAND array, as is known.

On the memory cell array 11, word lines WL run in the row direction, and bit lines BL run in the column direction. The word lines WL are connected to a row decoder 12. The bit lines BL are connected to a sense amplifier 15 having a latch function for temporarily storing write data or read data. The sense amplifier is connected to an I/O buffer 14 through a column gate (column selecting switch) 13.

The column gate 13 is controlled by the output signal from a column decoder 16. A boost circuit 19 generates voltages necessary for write, erase, and read modes. For example, in the write mode, the boost circuit 19 generates a program potential Vpgm and applies it to the row decoder 12.

A row address signal is input to the row decoder 12. A column address signal is input to the column decoder 16. A control circuit 21 controls the operation of the row decoder 12, column gate 13, and column decoder 16 in accordance with the operation mode. For example, in the write mode, the control circuit 21 controls the switching timing of a potential to be applied to the word line WL (control gate line) or select gate line.

FIG. 2 is a block diagram showing the circuit arrangement of the memory cell array 11 shown in FIG. 1.

In this example, a cell unit is formed from a NAND array including four memory cells connected in series and two select gate transistors respectively connected to the two terminals of the NAND array.

The drain-side terminal of each cell unit is connected to a bit line BLj (j=0, 1, . . . ). Each bit line BLj is connected to a sense amplifier S/A having a latch function through a high voltage type MOS transistor. A control signal BLTR is input to the gate of the high voltage type MOS transistor. The source-side terminal of each cell unit is connected to a source line common to all cell units.

The group of memory cells connected to one word line (control gate line) WLi (i=0, 1, 2, 3) is normally called a page. One page is a unit of memory cells that are simultaneously write- or read-accessed in, e.g., a data write mode or data read mode for reading data from the memory cells to the sense amplifiers. To read data from the chip to the outside, the data of one page in the sense amplifiers are serially read from the chip to the outside in units of bits or in units of a plurality of bits.

The group of memory cells connected to a plurality of (four, in this example) word lines WL0, WL1, WL2, and WL3 between two select gate lines is normally called a block. One block is a unit of memory cells for which the erase is simultaneously executed in, e.g., a data erase mode. An erase mode executed for each block is called a block erase mode, and an erase mode executed for all blocks is called a chip erase mode.

The basic operations of the NAND flash memory, i.e., erase, write and read operations will be described next briefly.

Table 1 shows the potential relationship in the erase mode. Table 2 shows the potential relationships in the write and read modes.

TABLE 1

|  | Erase |
| --- | --- |
| Well | Vera |
| Word line in selected block | 0V |
| Word line in unselected block | Floating |
| SGD | Floating |
| SGS | Floating |

TABLE 2

|  | Write | Read |
| --- | --- | --- |
| Selected bit line | 0V | Clamp level |
| Unselected bit line | VDD | — |
| Selected word line | Vpgm | 0V |
| Unselected word line | Vpass | Vread |
| SGD | VDD/0V | Vread/0V |
| SGS | 0V | Vread/0V |

Selected block/Unselected block

In the erase mode, the well is set to an erase potential Vera (e.g., about 20V). All word lines in a selected block (block for which the erase is to be executed) are set to 0V, and all word lines in an unselected block (block for which no erase is to be executed) are set in a floating state.

A drain-side select gate line SGD and source-side select gate line SGS are also set in the floating state.

In the write mode, a selected bit line (bit line to which a memory cell to be write-accessed is connected) is set to 0V. An unselected bit line (bit line to which a write inhibit cell is connected) is set to, e.g., a power supply potential VDD. A selected word line (control gate line) is set to the program potential Vpgm (e.g., about 16V), and an unselected word line is set to an intermediate potential Vpass (e.g., about 8V).

In the selected block, the drain-side select gate line SGD is set to the power supply potential VDD, and the source-side select gate line SGS is set to 0V. In the unselected block, both the drain-side select gate line SGD and source-side select gate line SGS are set to 0V.

The program potential Vpgm may be stepped up by a predetermined amount dV in accordance with the number of times of write.

In the read mode, the bit line is precharged to, e.g., the clamp level of the bit line. After that, a selected word line (control gate line) is set to 0V, and an unselected word line is set to a read potential Vread (e.g., about 3.5V).

For a binary (2-level type) memory, since the threshold value of a "1"-cell is negative (less than 0V), and that of a "0"-cell is positive (more than 0V and less than Vread), all memory cells connected to an unselected word line are turned on. Hence, the potential of the bit line is determined by ON/OFF-controlling the memory cells connected to the selected word line. The change in bit line potential is detected by the sense amplifier having the latch function.

In the selected block, both the drain-side select gate line SGD and source-side select gate line SGS are set to the read potential Vread. In the unselected block, both the drain-side select gate line SGD and source-side select gate line SGS are set to 0V.

Details of the write operation of the NAND flash memory shown in FIGS. 1 and 2 will be described next.

Assumptions are that the word line WL2 shown in FIG. 2 is selected, of the memory cells connected to the word line WL2, a memory cell A indicated by a broken line is the selected cell (cell to be subjected to "0"-programming), and the remaining memory cells are unselected cells (cells to be subjected to "1"programming, i.e., write inhibit cell).

FIG. 3 is a waveform chart showing signal waveforms of a first conventional write scheme, i.e., self boost write scheme.

First, write data of one page are input from the outside of the chip to the sense amplifiers S/A (data load). Since "0"-programming (write operation for increasing the threshold value) is to be executed only for the memory cell A, data "0" is input to the sense amplifier S/A connected to a selected bit line BL2, and data "1" is input to the sense amplifiers S/A connected to remaining bit lines BL0, BL1, BL3, and BL4.

In the NAND flash memory, each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 3, BL"0" represents the bit line BL2 connected to the memory cell A to be subjected to "0"-programming, and BL"1" represents the bit lines BL0, BL1, BL3, and BL4 connected to cells (write inhibit cells) to be subjected to "1"-programming.

In the write operation, first, the control signal BLTR changes to "H" level (potential capable of sufficiently transferring the power supply potential VDD) to transfer the data in the sense amplifiers S/A to the bit lines BLj (j=0, 1, . . . ). That is, the bit line BL2 connected to the sense amplifier S/A with the data "0" changes to "0" ("L" level=0V), and the bit lines BL0, BL1, BL3, and BL4 connected to the sense amplifiers S/A with "1" the data "1" change to "1" ("H" level=VDD).

When the drain-side select gate line SGD in the selected block is set to the power supply potential VDD, the drain-side select gate transistors in the selected block are turned on. As a result, the data (potential) of the bit lines are transferred to the memory cells in the cell units in the selected block.

For example, since the selected bit line BL2 is at "0", "0" (0V) is transferred to the memory cells in the cell unit connected to the selected bit line BL2. Since the unselected bit lines BL0, BL1, BL3, and BL4 are at "1", "1" (VDD-Vth) is transferred to the memory cells in the cell units connected to the unselected bit lines BL0, BL1, BL3, and BL4.

Vth is the threshold value of the drain-side select gate transistor.

If all memory cells in the cell units in the selected block are in the erase state ("1" state), these memory cells are in the normally on state, so the channels of all memory cells in the cell unit connected to the selected bit line BL2 are charged to "0" (0V). The channels of all memory cells in the cell units connected to the unselected bit lines BL0, BL1, BL3, and BL4 are charged to "1" (VDD-Vth).

If the memory cells in the cell units in the selected block include a memory cell in the "0"-programming state ("0" state), that memory cell is turned off because the potentials of all word lines are currently 0V. For this reason, the channels of memory cells on the drain side of that memory cell are charged to 0V (in case of "0"-programming) or VDD-Vth (in case of "1"programming).

After that, in the selected block, the program potential Vpgm is applied to the selected word line WL2, and the intermediate potential Vpass (0<Vpass<Vpgm) is applied to the unselected word lines WL0, WL1, and WL3.

Since the channels of the memory cells in the cell unit connected to the selected bit line BL2 are at "0" (0V), an electric field sufficient for the write (increase in threshold value by tunnelling) is applied across the channel and control gate electrode of the selected memory cell A.

On the other hand, when the program potential Vpgm and intermediate potential Vpass are applied to the word lines, the channel potential of the memory cells in the cell units connected to the unselected bit lines BL0, BL1, BL3, and BL4 rises due to capacitive coupling. Hence, no sufficient electric field is applied across the channel and the control gate electrode.

The channel potential of the memory cells in the cell units connected to the unselected bit lines BL0, BL1, BL3, and BL4 rises to the write inhibit potential that is mainly determined by the intermediate potential Vpass and a coupling ratio α of the memory cells.

With this operation, in the memory cells of one page connected to the selected word line WL2, "0"-programming (write operation for increasing the threshold value) is executed for the selected memory cell A, and "1"-programming (write operation for maintaining the "1" state) is executed for the remaining unselected memory cells.

In the above-described self boost write scheme, however, in transferring the potential VDD ("1") of write inhibit level from the unselected bit lines BL0, BL1, BL3, and BL4 to the cell units in the selected block, so-called threshold voltage drop (drop of the transferring potential) occurs in the drain-side select gate transistors. That is, the potential VDD-Vth that is lower than the power supply potential VDD by the threshold value Vth of the select gate transistor is applied to the channels of the memory cells.

The potential VDD-Vth becomes the initial potential in raising the channel potential. That the initial potential decreases by Vth means that the final channel potential after channel boost also decreases by Vth. That is, since the channel potential of the write inhibit cell insufficiently rises, an erratic program ("0"-programming) readily occurs.

Write schemes developed aiming at preventing such an erratic program and improving reliability of a flash memory are known.

One of them is a write scheme called a select gate transistor boost scheme and is disclosed in, e.g., Jpn. Pat. Appln. KOKAI Publication Nos. 10-223866 and 11-185488. Another scheme is a write scheme called a source program scheme and is disclosed in Jpn. Pat. Appln. KOKAI Publication No. 10-275481.

FIG. 4 is a waveform chart showing signal waveforms of a second conventional write scheme, i.e., select gate transistor boost scheme.

As a characteristic feature of this write scheme, to prevent the threshold voltage drop in transferring the power supply potential VDD ("1") of write inhibit level to a cell unit, the gate potential of the drain-side select gate transistor at the time of VDD transfer is set to a potential VSG higher than the power supply potential VDD.

When the gate potential of the drain-side select gate transistor is set to the potential VSG higher than the power supply potential VDD, the initial channel potential of a memory cell before channel boost becomes higher than at least VDD−Vth. In addition, when the potential VSG is set to be VDD+Vth or more, the power supply potential VDD can be directly transferred to the cell unit.

As described above, according to the select gate transistor boost scheme, since the initial channel potential before channel boost can be set to be sufficiently high, the channel potential of the write inhibit cell can be sufficiently raised at the time of channel boost. Hence, any erratic program ("0"-programming) can be suppressed, and a very reliable flash memory can be provided.

In the signal waveforms shown in FIG. 4, the potentials of all word lines in the selected block are set to Vread (potential for turning on both the "0" and "1" cells: e.g., about 3.5V) in advance so as to turn on all memory cells in the selected block to transmit the initial potential to the channels of these memory cells and set the channels of write inhibit cells to a sufficiently high potential after channel boost.

FIG. 5 is a waveform chart showing signal waveforms of a third conventional write scheme, i.e., source program scheme.

As a characteristic feature of this write scheme, in consideration of the fact that the source line has a capacitance smaller than that of the bit line and can be charged to a voltage higher than VDD, the initial potential before channel boost is transferred from the source-side select gate transistor, i.e., source line to a cell unit.

First, a source potential CELSRC and the potential of the source-side select gate line SGS are set to Vread (about 3.5V). The potential Vread is transferred from the source line to the cell units through the source-side select gate transistors. Consequently, the channels of memory cells in all cell units in the selected block are charged to Vread−Vth where Vth is the threshold value of the source-side select gate transistor.

After that, in the word lines in the selected block, the program potential Vpgm is applied to the selected word line, and the intermediate potential Vpass is applied to the unselected word lines. As a result, the channels of memory cells in all cell units in the selected block rise to the write inhibit potential.

After this channel boost, write data is transferred from the drain-side select gate transistors, i.e., bit lines to the cell units. That is, the potential of the drain-side select gate line SGD is set to the power supply potential VDD.

When the write data is "0", the potential (0V) of the bit lines is transferred to the cell units through the drain-side select gate transistors. In this case, the channel potential of the memory cells in the cell units drops from the write inhibit potential to 0V.

When the write data is "1", the potential of the bit lines is the power supply potential VDD, and the drain-side select gate transistors are cut off. In this case, the channel potential of the memory cells in the cell units keeps the write inhibit potential.

Hence, when the write data is "0", an electric field sufficient for the write is applied across the channel and control gate electrode of a memory cell, so "0"-programming is executed. When the write data is "1", no electric field sufficient for the write is applied across the channel and control gate electrode of a memory cell, so "1"-programming is executed.

As described above, according to the source program scheme, the initial potential before channel boost is transferred from the source line to a cell unit. Since the initial channel potential before channel boost can be set to be sufficiently high, the channel potential of a write inhibit cell can be sufficiently raised at the time of channel boost. Hence, any erratic program ("0"-programming) can be suppressed, and a very reliable flash memory can be provided.

In the self boost write scheme shown in FIG. 3 and the select gate transistor boost scheme shown in FIG. 4, to transfer the write data (0V or VDD) to a cell unit, the drain-side select gate line SGD is set to the power supply potential VDD or potential VSG higher than VDD. In the source program scheme shown in FIG. 5, after the program potential Vpgm is applied to the selected word line, the drain-side select gate line SGD is set to a value more than 0V (e.g., VDD) to allow transferring 0V from the bit line to the cell unit.

However, in recent years, the memory cell size is becoming small, and the pitch of word lines and select gate lines is also considerably decreasing. When the pitch of word lines (including select gate lines) becomes small, for example, the channel length of the select gate transistor is shortened, resulting in an increase in leakage current in cutting off the transistor.

Simultaneously, the capacitive coupling between adjacent word lines (including select gate lines) increases. This may raise, e.g., the gate potential of the select gate transistor to change the select gate transistor from the cut-off state to the ON state in applying the program potential Vpgm.

In this state, the initial potential (write inhibit potential) of the channels of precharged memory cells in the cell unit is removed to the bit line in applying the program potential Vpgm. As a consequence, no sufficient write inhibit potential can be obtained after channel boost. For this reason, an erratic program ("0"-programming) readily occurs, and the reliability of the flash memory degrades.

BRIEF SUMMARY OF THE INVENTION

It is an object of the present invention to apply the initial potential to a cell unit, then apply the program potential Vpgm and intermediate potential Vpass to a word line, and apply to the gate electrodes of the select gate transistors a potential capable of sufficiently keeping the drain- and source-side select gate transistors in the cut-off state until channel boost is ended, thereby preventing the write inhibit potential from dropping due to a leakage current at the time of channel boost.

According to the present invention, there is provided a nonvolatile semiconductor memory comprising at least one memory cell, and a select gate transistor connected between a bit line and the at least one memory cell, wherein write operation is performed during continuous first, second, and third periods, and when gate potentials of the select gate transistor during these periods are represented by first, second, and third potentials, respectively, a relationship given by first potential>third potential>second potential holds.

Additional objects and advantages of the present invention will be set forth in the description which follows, and in part will be obvious from the description, or may be learned by practice of the present invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

FIG. 7 is a block diagram showing the circuit arrangement of the memory cell array shown in FIG. 6;

FIG. 8 is a waveform chart showing a write scheme according to the first embodiment of the present invention;

DETAILED DESCRIPTION OF THE INVENTION

A nonvolatile semiconductor memory of the present invention will be described below in detail with reference to the accompanying drawing.

First Embodiment

Figure 6:
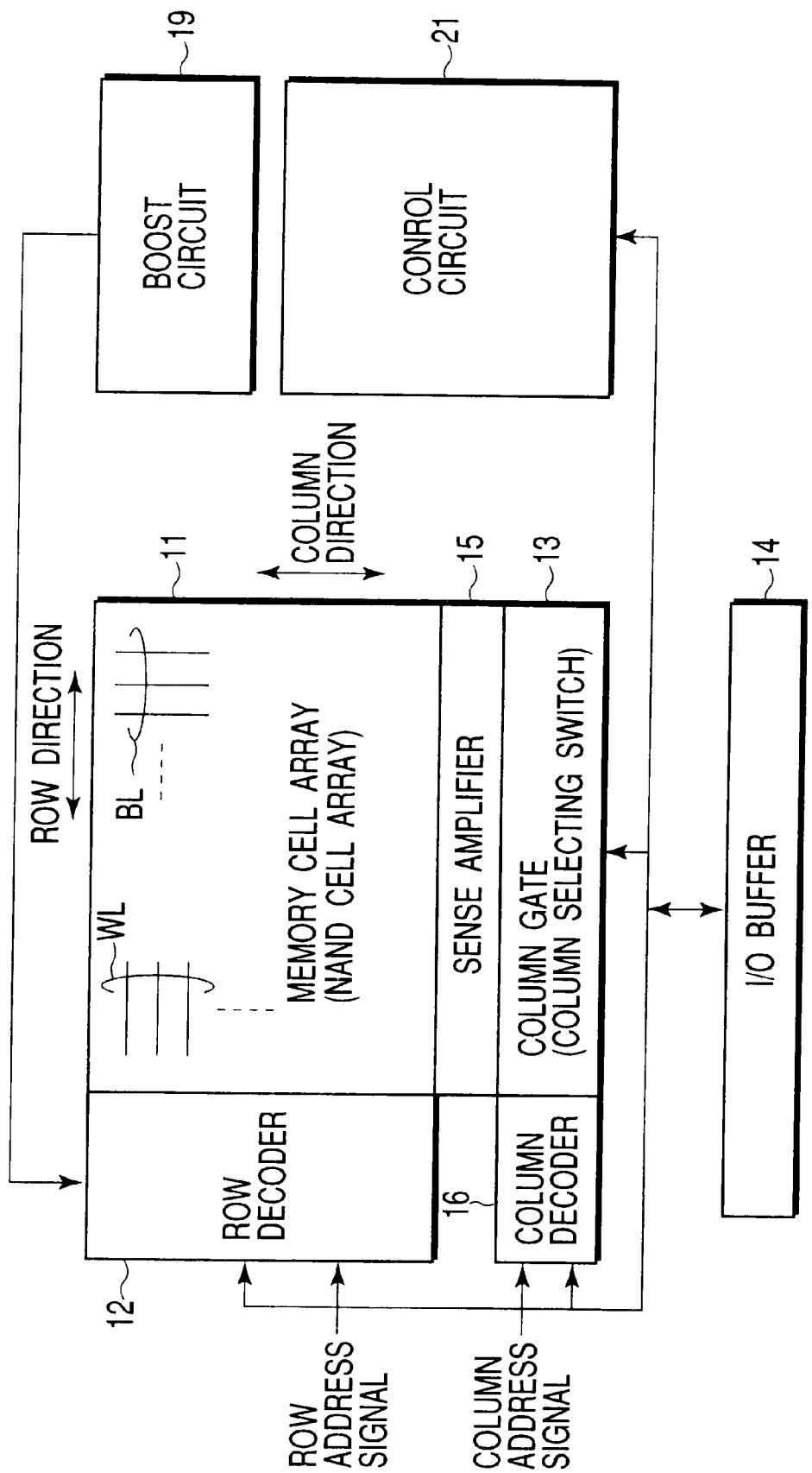
FIG. 6 is a block diagram showing a NAND flash memory to which a write scheme of the present invention is applied.

FIG. 6 is a block diagram showing main part of a NAND flash memory to which a write scheme of the present invention is applied.

A memory cell array 11 has a plurality of cell units laid out in an array. Each cell unit is formed from a NAND array including a plurality of memory cells connected in series and two select gate transistors respectively connected to the two terminals of the NAND array, as is known.

On the memory cell array 11, word lines WL run in the row direction, and bit lines BL run in the column direction. The word lines WL are connected to a row decoder 12. The bit lines BL are connected to a sense amplifier 15 having a latch function for temporarily storing write data or read data. The sense amplifier is connected to an I/O buffer 14 through a column gate (column selecting switch) 13.

The column gate 13 is controlled by the output signal from a column decoder 16. A boost circuit 19 generates voltages necessary for write, erase, and read modes. For example, in the write mode, the boost circuit 19 generates a program potential Vpgm and applies it to the row decoder 12.

A row address signal is input to the row decoder 12. A column address signal is input to the column decoder 16. A control circuit 21 controls the operation of the row decoder 12, column gate 13, and column decoder 16 in accordance with the operation mode. For example, in the write mode, the control circuit 21 controls the switching timing of a potential to be applied to the word line WL (control gate line) or select gate line.

FIG. 7 is a block diagram showing the circuit arrangement of the memory cell array 11 shown in FIG. 6.

In this example, a cell unit is formed from a NAND array including four memory cells connected in series and two select gate transistors respectively connected to the two terminals of the NAND array.

The drain-side terminal of each cell unit is connected to a bit line BLj (j=0, 1, ...). Each bit line BLj is connected to a sense amplifier S/A having a latch function through a high voltage type MOS transistor. A control signal BLTR is input to the gate of the high voltage type MOS transistor. The source-side terminal of each cell unit is connected to a source line common to all cell units.

The group of memory cells connected to one word line (control gate line) WLi (i=0, 1, 2, 3) is normally called a page. One page is a unit of memory cells that are simultaneously write- or read-accessed in, e.g., data write operation or data read operation of reading data from the memory cells to the sense amplifiers. To read data from the chip to the outside, the data of one page in the sense amplifiers are serially read from the chip to the outside in units of bits or in units of a plurality of bits.

The group of memory cells connected to a plurality of (four, in this example) word lines WL0, WL1, WL2, and WL3 between two select gate lines is normally called a block. One block is a unit of memory cells for which the erase is simultaneously executed in, e.g., data erase operation. An erase mode executed for each block is called a block erase mode, and an erase mode executed for all blocks is called a chip erase mode.

An example in which the write scheme according to the present invention is applied to the above-described NAND flash memory will be described next.

Assumptions are that the word line WL2 shown in FIG. 7 is selected, of the memory cells connected to the word line WL2, a memory cell A indicated by a broken line is the selected cell (cell to be subjected to "0"-programming), and the remaining memory cells are unselected cells (cells to be subjected to "0"-programming, i.e., write inhibit cell).

FIG. 8 is a waveform chart showing signal waveforms of the write scheme according to the first embodiment of the present invention.

First, write data of one page are input from the outside of the chip to the sense amplifiers S/A (data load). Since "0"-programming (write operation for increasing the threshold value) is to be executed only for the memory cell A, data "0" is input to the sense amplifier S/A connected to a selected bit line BL2, and data "1" is input to the sense amplifiers S/A connected to remaining bit lines BL0, BL1, BL3, and BL4.

In the NAND flash memory, each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 8, BL"0" represents the bit line BL2 connected to the memory cell A to be subjected to "0"-programming, and BL"1" represents the bit lines BL0, BL1, BL3, and BL4 connected to cells (write inhibit cells) to be subjected to "1"-programming.

In the write operation, first, the control signal BLTR changes to "H" level (potential capable of sufficiently transferring the power supply potential VDD) to transfer the data in the sense amplifiers S/A to the bit lines BLj (j=0, 1, . . . ). That is, the bit line BL2 connected to the sense amplifier S/A with the data "0" changes to "0" ("L" level=0V), and the bit lines BL0, BL1, BL3, and BL4 connected to the sense amplifiers S/A with the data "1" change to "1" ("H" level =VDD).

In the write scheme according to the present invention, before the data of the bit line (data in the sense amplifier S/A) is transferred to the cell unit, a potential VSG1 (>power supply potential VDD) which can sufficiently transfer the data "1" (=VDD) of the unselected bit lines BL0, BL1, BL3, and BL4, i.e., write inhibit potential (initial potential) without, e.g., any threshold voltage drop is applied to the drain-side select gate line SGD (time t1).

At this time, in the write scheme according to the present invention, to always transfer the data "1" (=VDD) or "0" (=0V) of the bit line to the channels of all memory cells in the cell unit independently of the states (data patterns) of the memory cells in the cell unit, a potential Vread (e.g., 3.5V) is applied to all word lines in the selected block to turn on all memory cells in the cell unit.

As a result, for example, since the selected bit line BL2 is at "0", "0" (0V) is transferred to the channels of all memory cells in the cell unit connected to the selected bit line BL2. Since the unselected bit lines BL0, BL1, BL3, and BL4 are at "1", "1" (e.g., VDD) is transferred to the channels of all memory cells in the cell units connected to the unselected bit lines BL0, BL1, BL3, and BL4.

After this, before the program potential Vpgm and intermediate potential Vpass are applied, the potential of the drain-side select gate line SGD is dropped from VSG1 to VSG2 (time t2). The potential VSG2 is set to a value (e.g., 0V) with which the drain-side select gate transistor in the cell unit connected to each unselected bit line is always set in the cut-off state, charges accumulated in the channels of the memory cells in the cell unit are prevented from leaking, and the channel potential (write inhibit potential) is prevented from dropping.

After that, in the selected block, the program potential Vpgm is applied to the selected word line WL2, and the intermediate potential Vpass (0<Vpass<Vpgm) is applied to the unselected word lines WL0, WL1, and WL3 (time t3).

At this time, the drain-side select gate line SGD is set to the sufficiently low potential VSG2. For this reason, even when the program potential Vpgm and intermediate potential Vpass are applied to the word lines, and the potential of the drain-side select gate line SGD increases due to capacitive coupling, the drain-side select gate transistors are not turned on.

Hence, any leakage of the channel potential can be prevented when the program potential Vpgm and intermediate potential Vpass are applied, and after channel boost, a sufficiently high write inhibit potential can be obtained.

In the write scheme of the present invention, in applying the program potential Vpgm and intermediate potential Vpass, the drain-side select gate line SGD is set to the sufficiently small value VSG2, and the drain-side select gate transistors are in the cut-off state.

Hence, the channels of memory cells in all cell units in the selected block are boosted. That is, the channels of memory cells in the cell unit connected to the selected bit line BL2 rise from 0V to a predetermined potential determined by a coupling ratio α or the like. The channels of memory cells in the cell units connected to the unselected bit lines BL0, BL1, BL3, and BL4 sufficiently rise from VDD to a predetermined potential (write inhibit potential) determined by the coupling ratio α or the like.

After that, the potential of the drain-side select gate line SGD is raised from VSG2 to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channels of all memory cells in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0V), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL2, "0"-programming (write operation for increasing the threshold value) is executed for the selected memory cell A, and "1"-programming (write operation for maintaining the "1" state) is executed for the remaining unselected memory cells.

After that, the potential Vpgm of the selected word line WL2 and the potential Vpass of the unselected word lines WL0, WL1, and WL3 are reduced to 0V (time t5). Next, the potential VSG3 of the drain-side select gate line SGD is reduced to 0V (time t6), thereby ending the write operation.

For example, VSG1 is set to a potential VDD+Vth or more, VSG2 is set to 0V, and VSG3 is set to VDD. VDD is the internal power supply potential which is the write inhibit potential (initial potential) to be transferred to the channels of the memory cells. Vth is the threshold value of the drain-side select gate transistor.

The write scheme according to the first embodiment of the present invention has been described above in detail. The characteristic features will be summarized below.

Step 1 (Time t1)

The drain-side select gate line SGD is set to VSG1 to transfer the data "1" (=VDD) of the unselected bit line to the memory cells in the cell unit sufficiently (e.g., as the complete power supply potential VDD without any threshold voltage drop). The data "0" (=0V) of the selected bit lines is directly transferred to the memory cells in the cell unit.

The potentials of all word lines in the selected block are set to Vread to turn on all memory cells in the cell units in the selected block independently of their states (data patterns), thereby transferring the data "0" or "1" of the bit lines to all memory cells in the cell units.

Step 2 (Time t2)

The potential of the drain-side select gate line SGD is dropped from VSG1 to VSG2 to set the drain-side select gate transistors in all cell units in the selected block in the cut-off state.

Step 3 (Time t3)

The program potential Vpgm and intermediate potential Vpass are applied to the word lines to boost the channel potentials of memory cells in all cell units in the selected block by capacitive coupling. The channels of memory cells in the cell units connected to the unselected bit lines are set to a sufficiently high write inhibit potential.

Step 4 (Time t4)

The potential of the drain-side select gate line SGD is raised from VSG2 to VSG3 to turn on the drain-side select gate transistor in the cell unit connected to the selected bit line and set the channel potential of the memory cells in the cell unit connected to the selected bit line to 0V. Thus, "0"-programming is executed only for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in the write operation, the three potentials VSG1, VSG2, and VSG3 are applied to the drain-side select gate line SGD at predetermined timings.

The value VSG1 is determined aiming at sufficiently transferring the potential VDD of the unselected bit lines to the cell units (charging the cell units with a high initial potential). The value VSG2 is determined aiming at preventing the drain-side select gate transistors from being turned on (preventing leakage) even when the potential VSG2 increases due to capacitive coupling at the time of application of the program potential Vpgm. The value VSG3 is determined aiming at transferring 0V to the channels of memory cells in the cell unit connected to the selected bit line and, for the channels of memory cells in the cell units connected to the unselected bit lines, keeping the sufficiently high channel potential (write inhibit potential) even after boost.

To simultaneously achieve these purposes, VSG1>VSG3>VSG2 is satisfied.

As described above, according to the write scheme of the present invention, in transferring the write data of the bit lines to the cell units, the gate potential of the drain-side select gate transistors is set to VSG1, thereby obtaining a sufficiently high initial potential before channel boost. Additionally, at the time of channel boost (at the time of application of the program potential Vpgm), the gate potential of the drain-side select gate transistors is set to VSG2, thereby preventing leakage in channel boost.

Hence, for the channels of the unselected memory cells (write inhibit cells), a sufficiently high write inhibit potential can be obtained by channel boost, and consequently, any write error can be prevented, and the reliability can be improved.

When the gate potential of the drain-side select gate transistors is changed from VSG2 to VSG3, data "0" (=0V) can be transferred to the channel of the selected memory cell while maintaining the channel potential (write inhibit potential) of the unselected memory cells. Hence, "0"-programming is executed as usual for the selected memory cell.

Second Embodiment

Figure 9:
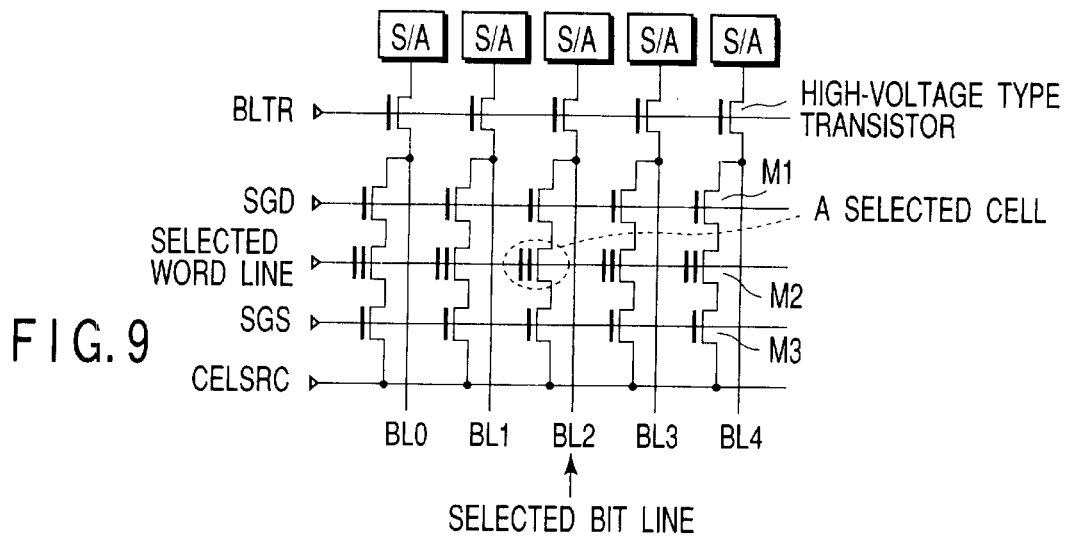
FIG. 9 is a block diagram showing the circuit arrangement of the memory cell array of a 3Tr-NAND to which the write scheme of the present invention is applied.

FIG. 9 is a block diagram showing the circuit arrangement of the memory cell array of a 3Tr-NAND to which the write scheme of the present invention is applied.

In this example, a 3Tr-NAND having a memory capacity of 32 kbytes will be described.

In the 3Tr-NAND, each cell unit in the memory cell array is formed from three transistors, i.e., one memory cell M2 and two select transistors M1 and M3 that sandwich the memory cell M2.

The memory cell M2 has, e.g., a stacked gate structure having a floating gate electrode and control gate electrode. Each of the select transistors M1 and M3 has, e.g., a structure similar to the stacked gate structure. However, each select transistor functions as a normal MOS transistor by using a lower gate as an actual gate electrode.

One terminal of a cell unit is connected to one of bit lines BL0, BL1, . . . , and the other terminal is connected to a cell source line. The bit lines BL0, BL1, . . . are connected to sense amplifiers S/A through high voltage type MOS transistors, respectively. Each of the sense amplifiers S/A is arranged in correspondence with one of the bit lines BL0, BL1, and has a latch circuit (page latch) LATCH. The sense amplifier S/A has a function of temporarily storing program data in programming.

The 3Tr-NAND can be regarded as a device obtained by decreasing the number of memory cells in a cell unit of a NAND flash memory to one.

As characteristic features of the 3Tr-NAND, a high-speed data read is possible, the data erase unit is small, the power consumption is low, and the cell size is relatively small. In addition, since each cell unit has only one memory cell, any read disturb need not be avoided, i.e., no read potential Vread need be applied to the word line of each unselected cell. For this reason, stress by the read potential Vread can be avoided. As described above in the first embodiment, since no intermediate potential Vpass need be applied to a write inhibit cell in programming, no stress by the intermediate potential Vpass is imposed on the write inhibit cell, and high reliability can be realized.

An example in which the write scheme of the present invention is applied to the above-described 3Tr-NAND will be described next.

Assumptions are that of the memory cells connected to a selected word line WL, a memory cell A indicated by a broken line is the selected cell (cell to be subjected to "0"-programming), and the remaining memory cells are unselected cells (cells to be subjected to "1"-programming, i.e., write inhibit cell).

Figure 10:
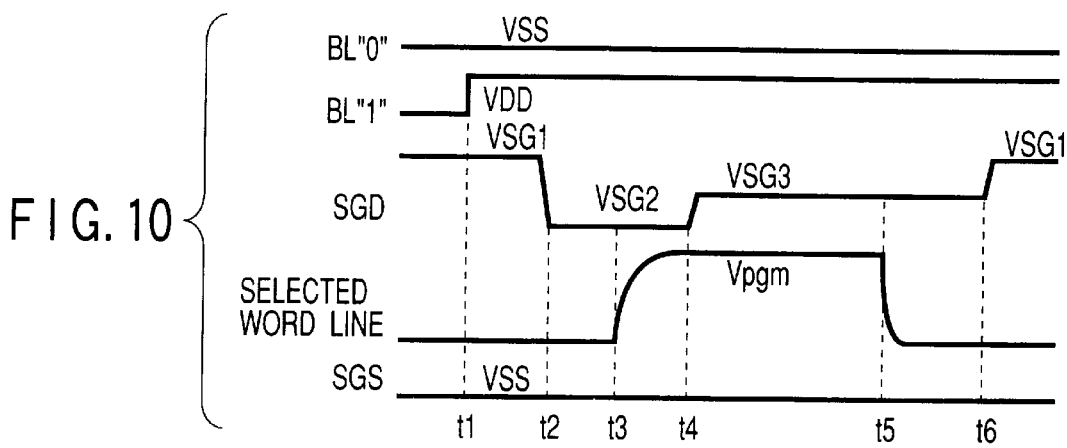
FIG. 10 is a waveform chart showing a write scheme according to the second embodiment of the present invention.

FIG. 10 is a waveform chart showing signal waveforms of the write scheme according to the second embodiment of the present invention.

First, write data of one page are input from the outside of the chip to the sense amplifiers S/A (data load). Since "0"-programming (write operation for increasing the threshold value) is to be executed only for the memory cell A, data "0" is input to the sense amplifier S/A connected to a selected bit line BL2, and data "1" is input to the sense amplifiers S/A connected to remaining bit lines BL0, BL1, BL3, and BL4.

In the 3Tr-NAND, each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data"1".

Referring to the signal waveform chart of FIG. 10, BL"0" represents the bit line BL2 connected to the memory cell A to be subjected to "0"-programming, and BL"1" represents the bit lines BL0, BL1, BL3, and BL4 connected to cells (write inhibit cells) to be subjected to "1"-programming.

In the write operation, first, a control signal BLTR changes to "H" level (potential capable of sufficiently transferring a power supply potential VDD) to transfer the data in the sense amplifiers S/A to the bit lines BLj (j=0, 1, . . . ). That is, the bit line BL2 connected to the sense amplifier S/A with the data "0" changes to "0" ("L" level=0V), and the bit lines BL0, BL1, BL3, and BL4 connected to the sense amplifiers S/A with the data "1" change to "1" ("H" level= VDD).

In the write scheme according to the present invention, before the data of the bit line (data in the sense amplifier S/A) is transferred to the cell unit, a potential VSG1 (>power supply potential VDD) which can sufficiently transfer the data "1" (=VDD) of the unselected bit lines BL0, BL1, BL3, and BL4, i.e., write inhibit potential (initial potential) without, e.g., any threshold voltage drop is applied to a drain-side select gate line SGD (time t1).

The potential VSG1 is applied before the data of the sense amplifier S/A is output to the bit line, e.g., from the time when the selected block is determined by the block address. The reason for this will be described later.

Since the selected bit line BL2 is at "0", "0" (0V) is transferred to the channel of the memory cell in the cell unit connected to the selected bit line BL2. Since the unselected bit lines BL0, BL1, BL3, and BL4 are at "0", "1" (e.g., VDD) is transferred to the channels of memory cells in the cell units connected to the unselected bit lines BL0, BL1, BL3, and BL4.

After this, before the program potential Vpgm is applied, the potential of the drain-side select gate line SGD is dropped from VSG1 to VSG2 (time t2).

The potential VSG2 is set to a value (e.g., 0V) that satisfies the following conditions: the drain-side select gate transistors in the cell units connected to the unselected bit lines are kept cut off, charges accumulated in the channels of the memory cells do not leak, and the channel potential (write inhibit potential) does not drop.

After that, in the selected block, the program potential Vpgm is applied to the selected word line WL (time t3).

At this time, the drain-side select gate line SGD is set to the sufficiently low potential VSG2. For this reason, even when the program potential Vpgm is applied to the word lines, and the potential of the drain-side select gate line SGD increases due to capacitive coupling, the drain-side select gate transistors are not turned on. Hence, any leakage of the channel potential can be prevented when the program potential Vpgm is applied, and after channel boost, a sufficiently high write inhibit potential can be obtained.

In the write scheme of the present invention, in applying the program potential Vpgm, the drain-side select gate line SGD is set to the sufficiently small value VSG2, and the drain-side select gate transistors are in the cut-off state.

Hence, the channels of memory cells in all cell units in the selected block are boosted. That is, the channels of memory cells in the cell unit connected to the selected bit line BL2 rise from 0V to a predetermined potential determined by a coupling ratio α or the like. The channels of memory cells in the cell units connected to the unselected bit lines BL0, BL1, BL3, and BL4 sufficiently rise from VDD to a predetermined potential (write inhibit potential) determined by the coupling ratio α or the like.

After that, the potential of the drain-side select gate line SGD is raised from VSG2 to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channel of the memory cell in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0v), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL, "0"-programming (write operation for increasing the threshold value) is executed for the selected memory cell A, and "1"- programming (write operation for maintaining the "1" state) is executed for the remaining unselected memory cells.

After that, the potential Vpgm of the selected word line WL is reduced to 0V (time t5). Next, the potential of the drain-side select gate line SGD is reduced from VSG3 to VSG1 (time t6), thereby ending the write operation.

Before and after the above-described write operation, the drain-side select gate line SGD is set to the potential VSG1.

This is because the 3Tr-NAND is used as, e.g., the core memory of a JAVA card. That is, as the specifications of the core memory, a high-speed access at, e.g., 200 ns is required (the access time of a NAND flash memory is about 5 µs).

However, when the potential of the drain-side select gate line SGD is raised from, e.g., 0V to VSG1 in the data read, a margin for the potential rising must be ensured, and the access time becomes long. To make the access time in the data read as short as possible, the drain-side select gate line SGD is set to the potential VSG1 in advance.

For this purpose, the 3Tr-NAND employs the logic (sequence) for applying the potential VSG1 to the drain-side select gate line SGD when the block address is determined.

In the data programming mode as well, the potential VSG1 is applied to the drain-side select gate line SGD when the block address is determined.

For example, VSG1 is set to a potential VDD+Vth or more, VSG2 is set to 0V, and VSG3 is set to VDD. VDD is the internal power supply potential which is the write inhibit potential (initial potential) to be transferred to the channels of the memory cells. Vth is the threshold value of the drain-side select gate transistor.

The write scheme according to the second embodiment of the present invention has been described above in detail. The characteristic features will be summarized below.

Step 1 (Time t1)

The drain-side select gate line SGD is set in advance to VSG1 to transfer the data "1" (–VDD) of the unselected bit line to the memory cells in the cell unit sufficiently (e.g., as the complete power supply potential VDD without any threshold voltage drop). The data "0" (=0V) of the selected bit lines is also directly transferred to the memory cells in the cell unit.

Step 2 (Time t2)

The potential of the drain-side select gate line SGD is dropped from VSG1 to VSG2 to set the drain-side select gate transistors in all cell units in the selected block in the cut-off state.

Step 3 (Time t3)

The program potential Vpgm is applied to the word lines to boost the channel potentials of memory cells in all cell units in the selected block by capacitive coupling. The channels of memory cells in the cell units connected to the unselected bit lines are set to a sufficiently high write inhibit potential.

Step 4 (Time t4)

The potential of the drain-side select gate line SGD is raised from VSG2 to VSG3 to turn on the drain-side select gate transistor in the cell unit connected to the selected bit line and set the channel potential of the memory cells in the cell unit connected to the selected bit line to 0V. Thus, "0"-programming is executed only for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in the write operation, the three potentials VSG1, VSG2, and VSG3 are applied to the drain-side select gate line SGD at predetermined timings.

The value VSG1 is determined aiming at sufficiently transferring the potential VDD of the unselected bit lines to the cell units (charging the cell units with a high initial potential). The value VSG2 is determined aiming at preventing the drain-side select gate transistors from being turned on (preventing leakage) even when the potential VSG2 increases due to capacitive coupling at the time of application of the program potential Vpgm. The value VSG3 is determined aiming at transferring 0V to the channel of the memory cell in the cell unit connected to the selected bit line and, for the channels of memory cells in the cell units connected to the unselected bit lines, keeping the sufficiently high channel potential (write inhibit potential) even after boost.

To simultaneously achieve these purposes, VSG1>VSG3>VSG2 is satisfied.

As described above, according to the write scheme of the present invention, in transferring the write data of the bit lines to the cell units, the gate potential of the drain-side select gate transistors is set to VSG1, thereby obtaining a sufficiently high initial potential before channel boost. Additionally, at the time of channel boost (at the time of application of the program potential Vpgm), the gate potential of the drain-side select gate transistors is set to VSG2, thereby preventing leakage in channel boost.

Hence, for the channels of the unselected memory cells (write inhibit cells), a sufficiently high write inhibit potential can be obtained by channel boost, and consequently, any erratic program can be prevented, and the reliability can be improved.

When the gate potential of the drain-side select gate transistors is changed from VSG2 to VSG3, data "0" (=0V) can be transferred to the channel of the selected memory cell while maintaining the channel potential (write inhibit potential) of the unselected memory cells. Hence, "0"-programming is executed as usual for the selected memory cell.

In the write scheme of the present invention, since the drain-side select gate line SGD in the selected block is set to VSG1 when the block address is determined, the access time in the data read or data programming mode can be shortened.

Third Embodiment

Figure 1:
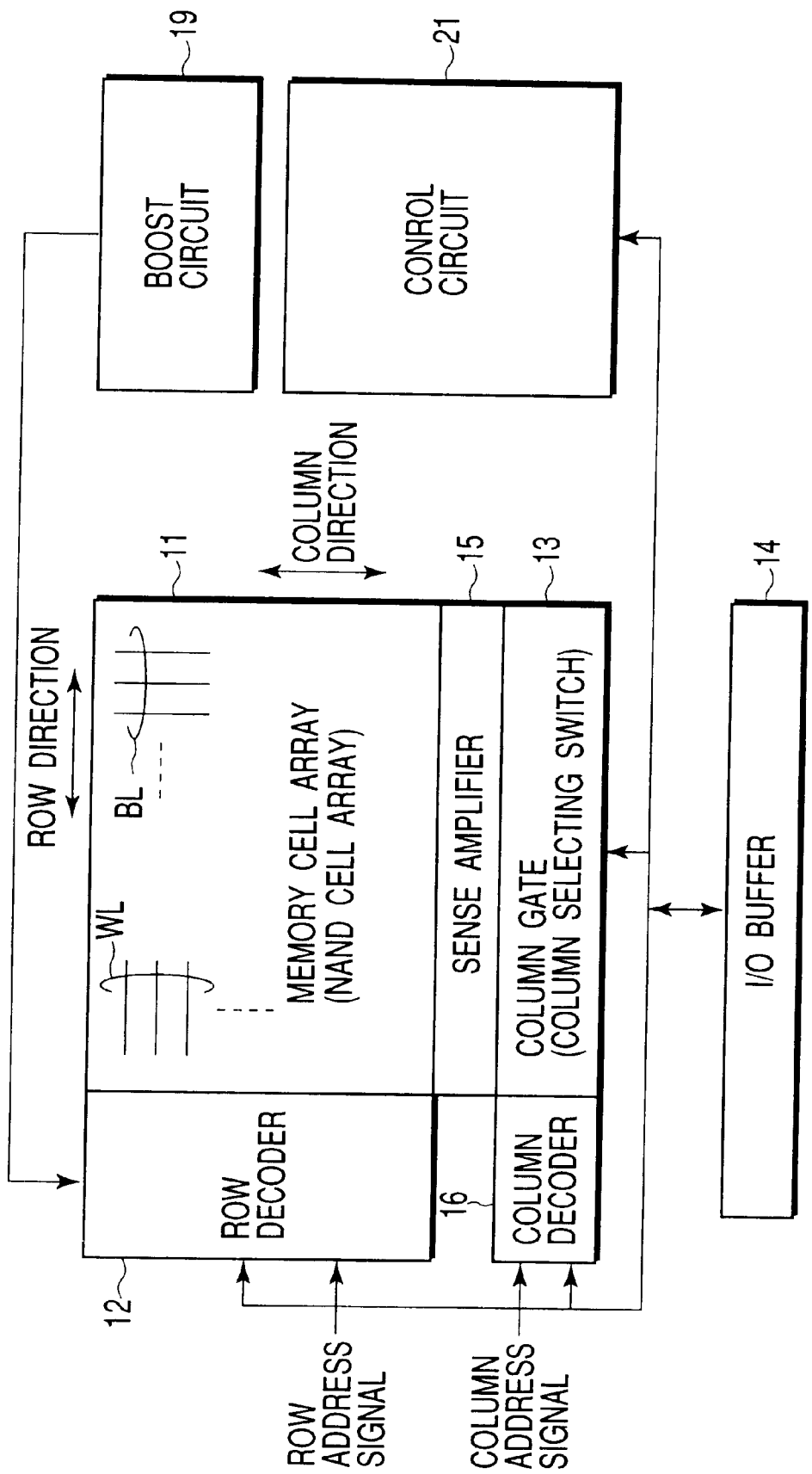
FIG. 1 is a block diagram showing a NAND flash memory to which a conventional write scheme is applied.
Figure 2:
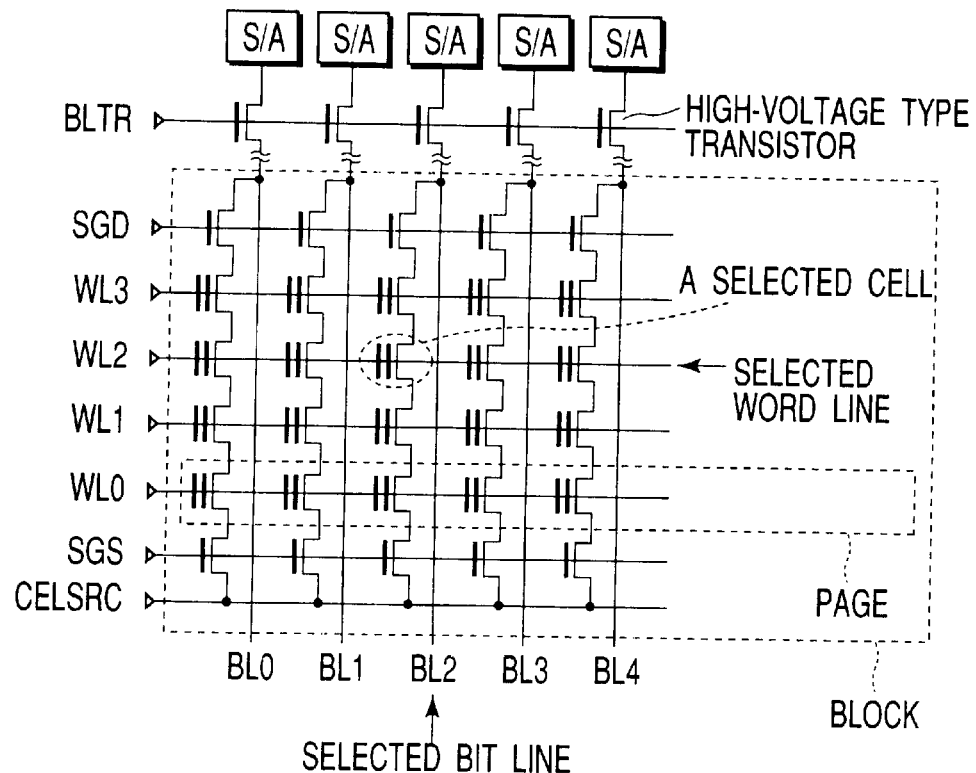
FIG. 2 is a block diagram showing the circuit arrangement of the memory cell array shown in FIG. 1.
Figure 3:
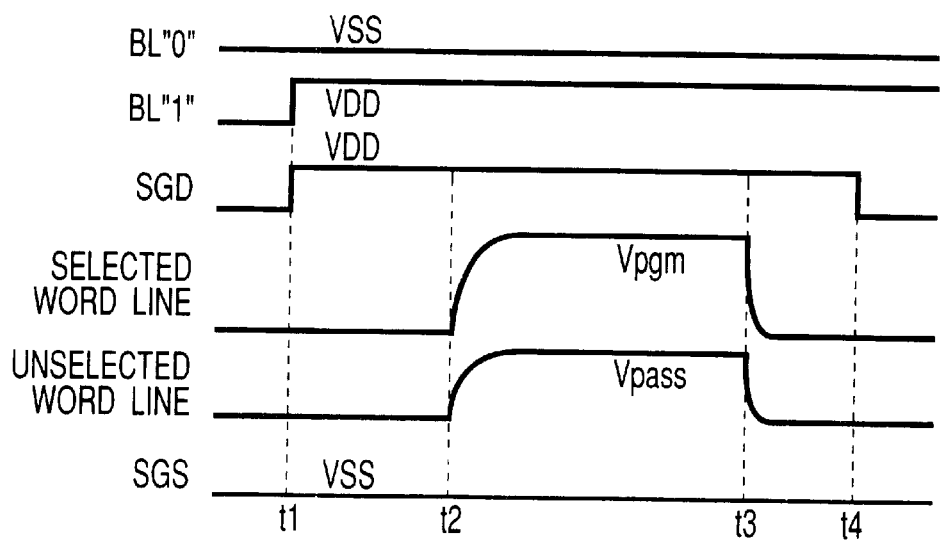
FIG. 3 is a waveform chart showing the first conventional write scheme.
Figure 4:
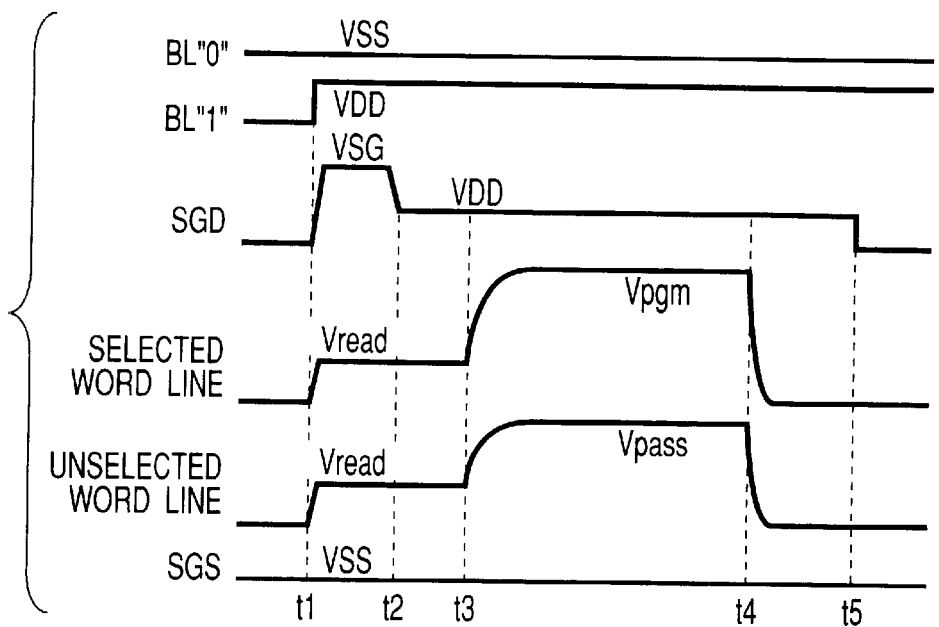
FIG. 4 is a waveform chart showing the second conventional write scheme.
Figure 5:
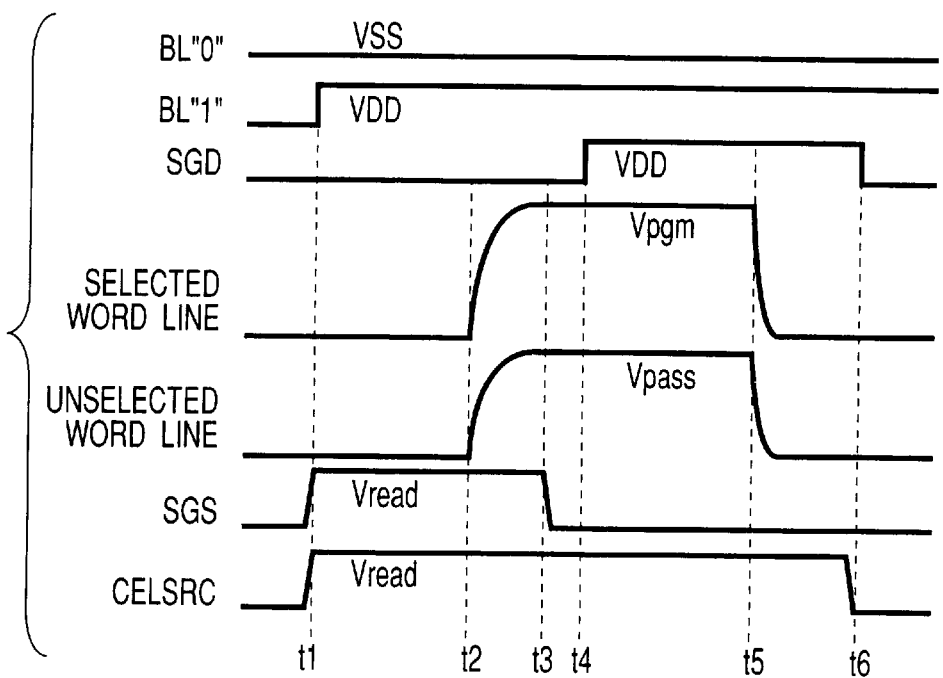
FIG. 5 is a waveform chart showing the third conventional write scheme.

The write scheme of this embodiment is an improvement example of the source program scheme (FIG. 5).

The write scheme according to this embodiment will be described using the NAND flash memory shown in FIGS. 6 and 7 as an example.

Assumptions are that a word line WL2 shown in FIG. 7 is selected, of the memory cells connected to the word line WL2, a memory cell A indicated by a broken line is the selected cell (cell to be subjected to "0"-programming), and the remaining memory cells are unselected cells (cells to be subjected to "1"-programming, i.e., write inhibit cell).

Figure 11:
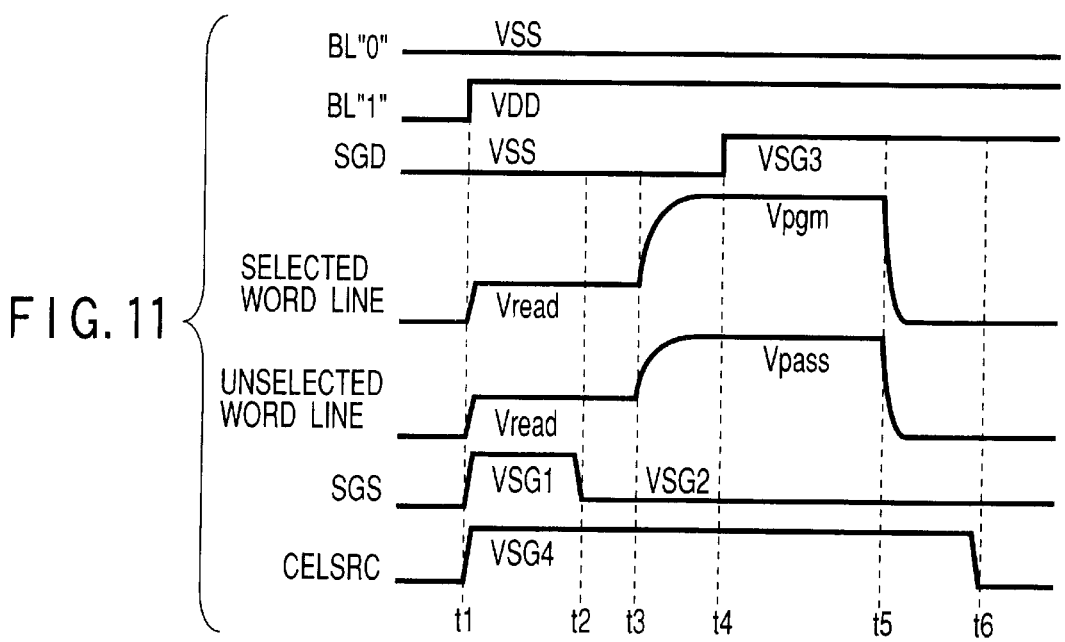
FIG. 11 is a waveform chart showing a write scheme according to the third embodiment of the present invention.

FIG. 11 is a waveform chart showing signal waveforms of the write scheme according to the third embodiment of the present invention.

First, write data of one page are input from the outside of the chip to the sense amplifiers S/A (data load).

Since "0"-programming (write operation for increasing the threshold value) is to be executed only for the memory cell A, data "0" is input to the sense amplifier S/A connected to a selected bit line BL2, and data "1" is input to the sense amplifiers S/A connected to remaining bit lines BL0, BL1, BL3, and BL4.

Each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 11, BL"0" represents the bit line BL2 connected to the memory cell A to be subjected to "0"-programming, and BL"1" represents the bit lines BL0, BL1, BL3, and BL4 connected to cells (write inhibit cells) to be subjected to "1"-programming.

In the write operation, first, a source line potential CELSRC is set to VSL4, and a source-side select gate line SGS is set to VSL1. The potential VSL4 is equal to or higher than, e.g., an internal power supply potential VDD. The potential VSG1 is set to be equal to or more than a value obtained by adding a threshold value Vth of the source-side select gate transistor to the potential VSL4. Thus, the potential VSL4 is transferred from the source line to the cell units through the source-side select gate transistors.

In the selected block selected by a block address, the potentials of all word lines (selected and unselected word lines) are set to Vread. The potential Vread (e.g., 3.5V) turns on all memory cells independently of the data patterns, i.e., the states ("0" or "1") of the memory cells.

Hence, the channels of memory cells in all cell units in the selected block are charged to VSL4 (time t1).

Simultaneously, a control signal BLTR changes to "H" level (potential capable of sufficiently transferring the power supply potential VDD) to transfer the data in the sense amplifiers S/A to the bit lines BLj (j=0, 1, . . . ). That is, the bit line BL2 connected to the sense amplifier S/A with the data "0" changes to "0" ("L" level=0V), and the bit lines BL0, BL1, BL3, and BL4 connected to the sense amplifiers S/A with the data "1" change to "1" ("H" level=VDD).

However, the potentials of the bit lines are not transmitted to the cell units because a drain-side select gate line SGD is set to 0V, and the drain-side select gate transistors are always kept off.

After this, before a program potential Vpgm and intermediate potential Vpass are applied, the potential of the source-side select gate line SGS is dropped from VSG1 to VSG2. The potential VSG2 is set to, e.g., VSS (=0V) (time t2).

The potential VSG2 is set to a value (e.g., 0V) that satisfies the following conditions: the source-side select gate transistors in the cell units connected to the unselected bit lines are always kept cut off, charges accumulated in the channels of memory cells in the cell units do not leak, and the channel potential (write inhibit potential) does not drop.

After that, in the selected block, the program potential Vpgm is applied to the selected word line WL2, and the intermediate potential Vpass (0<Vpass<Vpgm) is applied to the unselected word lines WL0, WL1, and WL3 (time t3).

At this time, the source-side select gate line SGS is set to the sufficiently low potential VSG2. For this reason, even when the program potential Vpgm and intermediate potential Vpass are applied to the word lines, and the potential of the source-side select gate line SGS increases due to capacitive coupling, the source-side select gate transistors are not turned on.

Hence, any leakage of the channel potential can be prevented when the program potential Vpgm and intermediate potential Vpass are applied, and after channel boost, a sufficiently high write inhibit potential can be obtained.

In the write scheme of the present invention, in applying the program potential Vpgm and intermediate potential Vpass, the source-side select gate line SGS is set to the sufficiently small value VSG2, and the source-side select gate transistors are in the cut-off state. Since the drain-side select gate line SGD is set to 0V, the drain-side select gate transistors are also in the cut-off state.

Hence, in applying the program potential Vpgm and intermediate potential Vpass, i.e., at the time of channel boost, the channels of memory cells in all cell units in the selected block are boosted.

More specifically, the channels of memory cells in the cell unit connected to the selected bit line BL2 and the channels of memory cells in the cell units connected to the unselected bit lines BL0, BL1, BL3, and BL4 sufficiently rise from VSL4 (initial potential) to a predetermined potential determined by a coupling ratio α or the like.

After that, the potential of the drain-side select gate line SGD is raised from VSS (=0V) to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channels of all memory cells in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0V), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL2, "0"-programming (write operation for increasing the threshold value) is executed for the selected memory cell A, and "1"-programming (write operation for maintaining the "1" state) is executed for the remaining unselected memory cells.

After that, the potential Vpgm of the selected word line WL2 and the potential Vpass of the unselected word lines WL0, WL1, and WL3 are reduced to 0V (time t5). Next, the potential VSG3 of the drain-side select gate line SGD is reduced to 0V (time t6), thereby ending the write operation.

For example, VSG1 is set to a potential VSL4+Vth or more, VSG2 is set to 0V, and VSG3 and VSL4 are set to a voltage (e.g., Vread) higher than VDD. VDD is the internal power supply potential which is the write inhibit potential (initial potential) to be transferred to the channels of the memory cells. Vth is the threshold value of the source-side select gate transistor.

The write scheme according to the third embodiment of the present invention has been described above in detail. The characteristic features will be summarized below.

Step 1 (Time t1)

The source-side select gate line SGS is set to VSG1, and the source line CELSRC is set to VSL4 to transfer the potential VSL4 of the source line CELSRC to all memory cells in the cell units in the selected block.

The potentials of all word lines in the selected block are set to Vread to turn on all memory cells in the cell units in the selected block independently of their states (data patterns), thereby transferring VSL4 to all memory cells in the cell units.

Step 2 (Time t2)

The potential of the source-side select gate line SGS is dropped from VSG1 to VSG2 to set the source-side select gate transistors in all cell units in the selected block in the cut-off state.

Step 3 (Time t3)

The program potential Vpgm and intermediate potential Vpass are applied to the word lines to boost the channel potentials of memory cells in all cell units in the selected block by capacitive coupling. The channels of memory cells in the cell units connected to the unselected bit lines are set to a sufficiently high write inhibit potential.

Step 4 (Time t4)

The potential of the drain-side select gate line SGD is raised from VSS (=0V) to VSG3 to turn on the drain-side select gate transistor in the cell unit connected to the selected bit line and set the channel potential of the memory cells in the cell unit connected to the selected bit line to 0V. Thus, "0"-programming is executed for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in applying the program potential, the source-side select gate line SGS is set to VSG2. For example, the two select gate lines SGS and SGD in the selected block are set to VSS (=0V).

Hence, in applying the program potential Vpgm, even when the potentials of the two select gate lines SGS and SGD slightly increase due to capacitive coupling, the select gate transistors in the selected block are not turned on. That is, in applying the program potential Vpgm, the select gate transistors do not cause any leakage, and a sufficiently high write inhibit potential can be obtained.

The value VSG1 is determined aiming at sufficiently transferring the potential VSL4 of the source line CELSRC to the cell units (charging the cell units with a high initial potential). The value VSG2 is determined aiming at preventing the source- and drain-side select gate transistors from being turned on (preventing leakage) even when the potential VSG2 increases due to capacitive coupling at the time of application of the program potential Vpgm. The value VSG3 is determined aiming at transferring 0V to the channels of memory cells in the cell unit connected to the selected bit line and, for the channels of memory cells in the cell units connected to the unselected bit lines, keeping the sufficiently high channel potential (write inhibit potential) even after boost.

In the source program scheme, VSG1 VSL4 may hold. As an important point of this embodiment, at the time of channel boost, the source-side select gate line SGS is set to VSG2 (e.g., 0V), and the drain-side select gate line SGD is set to 0V. In this case, the channels of all memory cells in the cell units in the selected block are boosted independently of the program data.

As described above, according to the write scheme of the present invention, the channels are charged from the source line CELSRC, thereby obtaining a sufficiently high initial potential before channel boost. Additionally, at the time of channel boost (at the time of application of the program potential Vpgm), the gate potential of the source-side select gate transistors is set to VSG2, thereby preventing leakage in channel boost.

Hence, for the channels of the unselected memory cells (write inhibit cells), a sufficiently high write inhibit potential can be obtained by channel boost, and consequently, any erratic program can be prevented, and the reliability can be improved.

When the gate potential of the drain-side select gate transistors is changed from VSS to VSG3, data "0" (=0V) can be transferred to the channel of the selected memory cell while maintaining the channel potential (write inhibit potential) of the unselected memory cells. Hence, "0"-programming is executed as usual for the selected memory cell.

Fourth Embodiment

The write scheme of this embodiment is an improvement example of the first embodiment.

The write scheme according to this embodiment will be described using the NAND flash memory shown in FIGS. 6 and 7 as an example.

Assumptions are that a word line WL2 shown in FIG. 7 is selected, of the memory cells connected to the word line WL2, a memory cell A indicated by a broken line is the selected cell (cell to be subjected to "0"-programming), and the remaining memory cells are unselected cells (cells to be subjected to "1"-programming, i.e., write inhibit cell).

Figure 12:
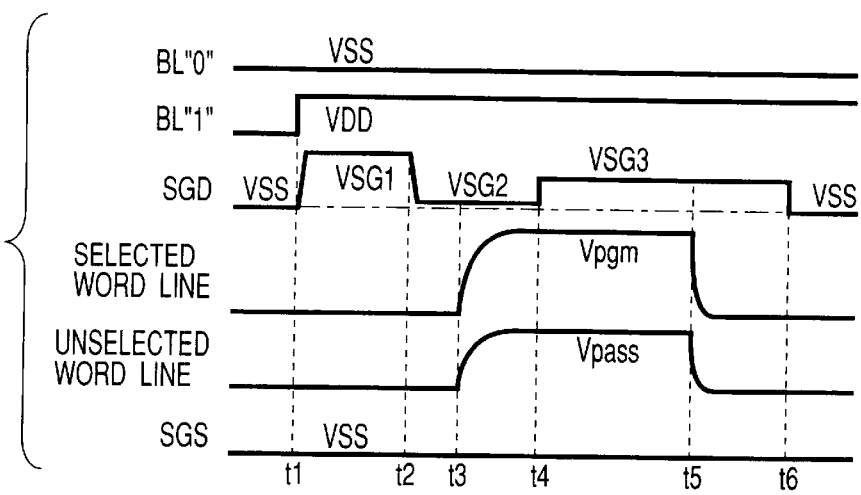
FIG. 12 is a waveform chart showing a write scheme according to the fourth embodiment of the present invention.

FIG. 12 is a waveform chart showing signal waveforms of the write scheme according to the fourth embodiment of the present invention.

First, write data of one page are input from the outside of the chip to sense amplifiers S/A (data load). Since "0"-programming (write operation for increasing the threshold value) is to be executed only for the memory cell A, data "0" is input to the sense amplifier S/A connected to a selected bit line BL2, and data "0" is input to the sense amplifiers S/A connected to remaining bit lines BL0, BL1, BL3, and BL4.

In the NAND flash memory, each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 12, BL"0" represents the bit line BL2 connected to the memory cell A to be subjected to "1"-programming, and BL"1" represents the bit lines BL0, BL1, BL3, and BL4 connected to cells (write inhibit cells) to be subjected to "1"-programming.

In the write operation, first, a control signal BLTR changes to "H" level (potential capable of sufficiently transferring a power supply potential VDD) to transfer the data in the sense amplifiers S/A to the bit lines BLj (j=0, 1, ... ). That is, the bit line BL2 connected to the sense amplifier S/A with the data "0" changes to "0" ( "L" level=0V), and the bit lines BL0, BL1, BL3, and BL4 connected to the sense amplifiers S/A with the data "1" change to "1" ("H" level= VDD).

In the write scheme according to the present invention, before the data of the bit line (data in the sense amplifier S/A) is transferred to the cell unit, a potential VSG1 (>power supply potential VDD) which can sufficiently transfer the data "1" (=VDD) of the unselected bit lines BL0, BL1, BL3, and BL4, i.e., write inhibit potential (initial potential) without, e.g., any threshold voltage drop is applied to a drain-side select gate line SGD (time t1).

At this time, in the write scheme according to the present invention, all word lines in the selected block are kept at 0V without applying Vread (e.g., 3.5V) to all the word lines, unlike the above-described first embodiment.

In this case, when all memory cells in the cell units are in the erase state ("1" state), a predetermined potential corresponding to program data is transferred to the channels of all the memory cells in the cell units. However, when the cell units include memory cells in the "0" state, a predetermined potential corresponding to the program data is transferred to the channels of memory cells on the drain side of the memory cell in the "0" state, which is closest to the drain side.

As a result, for example, since the selected bit line BL2 is at "0", "0" (0V) is transferred to the cell unit connected to the selected bit line BL2. Since the unselected bit lines BL0, BL1, BL3, and BL4 are at "1", "1" (e.g., VDD) is transferred to the cell units connected to the unselected bit lines BL0, BL1, BL3, and BL4.

After this, before a program potential Vpgm and intermediate potential Vpass are applied, the potential of the drain-side select gate line SGD is dropped from VSG1 to VSG2 (time t2).

The potential VSG2 is set to a value (e.g., 0V) that satisfies the following conditions: the drain-side select gate transistors in the cell units connected to the unselected bit lines are always kept cut off, charges accumulated in the channels of the memory cells do not leak, and the channel potential (write inhibit potential) does not drop.

After that, in the selected block, the program potential Vpgm is applied to the selected word line WL2, and the intermediate potential Vpass (0<Vpass<Vpgm) is applied to the unselected word lines WL0, WL1, and WL3 (time t3).

At this time, the drain-side select gate line SGD is set to the sufficiently low potential VSG2. For this reason, even when the program potential Vpgm and intermediate potential Vpass are applied to the word lines, and the potential of the drain-side select gate line SGD increases due to capacitive coupling, the drain-side select gate transistors are not turned on.

Hence, any leakage of the channel potential can be prevented when the program potential Vpgm and intermediate potential Vpass are applied, and after channel boost, a sufficiently high write inhibit potential can be obtained.

In the write scheme of the present invention, in applying the program potential Vpgm and intermediate potential Vpass, the drain-side select gate line SGD is set to the sufficiently small value VSG2, and the drain-side select gate transistors are in the cut-off state.

Hence, the channels of memory cells in all cell units in the selected block are boosted. That is, the channels of memory cells in the cell unit connected to the selected bit line BL2 rise from 0V to a predetermined potential determined by a coupling ratio α or the like. The channels of memory cells in the cell units connected to the unselected bit lines BL0, BL1, BL3, and BL4 sufficiently rise from VDD to a predetermined potential (write inhibit potential) determined by the coupling ratio α or the like.

After that, the potential of the drain-side select gate line SGD is raised from VSG2 to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channels of all memory cells in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0V), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL2, "0"-programming (write operation for increasing the threshold value) is executed for the selected memory cell A, and "1"programming (write operation for maintaining the "1" state) is executed for the remaining unselected memory cells.

After that, the potential Vpgm of the selected word line WL2 and the potential Vpass of the unselected word lines WL0, WL1, and WL3 are reduced to 0V (time t5). Next, the potential VSG3 of the drain-side select gate line SGD is reduced to 0V (time t6), thereby ending the write operation.

For example, VSG1 is set to a potential VDD+Vth or more, VSG2 is set to 0V, and VSG3 is set to VDD. VDD is the internal power supply potential which is the write inhibit potential (initial potential) to be transferred to the channels of the memory cells. Vth is the threshold value of the drain-side select gate transistor.

The write scheme according to the fourth embodiment of the present invention has been described above in detail. The characteristic features will be summarized below.

Step 1 (Time t1)

The drain-side select gate line SGD is set to VSG1 to transfer the data "1"(=VDD) of the unselected bit line to the memory cells in the cell unit sufficiently (e.g., as the complete power supply potential VDD without any threshold voltage drop). The data "0" (=0V) of the selected bit lines is directly transferred to the memory cells in the cell unit.

Step 2 (Time t2)

The potential of the drain-side select gate line SGD is dropped from VSG1 to VSG2 to set the drain-side select gate transistors in all cell units in the selected block in the cut-off state.

Step 3 (Time t3)

The program potential Vpgm and intermediate potential Vpass are applied to the word lines to boost the channel potentials of memory cells in all cell units in the selected block by capacitive coupling. The channels of memory cells in the cell units connected to the unselected bit lines are set to a sufficiently high write inhibit potential.

Step 4 (Time t4)

The potential of the drain-side select gate line SGD is raised from VSG2 to VSG3 to turn on the drain-side select gate transistor in the cell unit connected to the selected bit line and set the channel potential of the memory cells in the cell unit connected to the selected bit line to 0V. Thus, "0"-programming is executed only for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in the write operation, the three potentials VSG1, VSG2, and VSG3 are applied to the drain-side select gate line SGD at predetermined timings.

The value VSG1 is determined aiming at sufficiently transferring the potential VDD of the unselected bit lines to the cell units (charging the cell units with a high initial potential). The value VSG2 is determined aiming at preventing the drain-side select gate transistors from being turned on (preventing leakage) even when the potential VSG2 increases due to capacitive coupling at the time of application of the program potential Vpgm.

The value VSG3 is determined aiming at transferring 0V to the channels of memory cells in the cell unit connected to the selected bit line and, for the channels of memory cells in the cell units connected to the unselected bit lines, keeping the sufficiently high channel potential (write inhibit potential) after boost.

To simultaneously achieve these purposes, VSG1>VSG3>VSG2 is satisfied.

As described above, according to the write scheme of the present invention, in transferring the write data of the bit lines to the cell units, the gate potential of the drain-side select gate transistors is set to VSG1, thereby obtaining a sufficiently high initial potential before channel boost. Additionally, at the time of channel boost (at the time of application of the program potential Vpgm), the gate potential of the drain-side select gate transistors is set to VSG2, thereby preventing leakage in channel boost.

Hence, for the channels of the unselected memory cells (write inhibit cells), a sufficiently high write inhibit potential can be obtained by channel boost, and consequently, any erratic program can be prevented, and the reliability can be improved.

When the gate potential of the drain-side select gate transistors is changed from VSG2 to VSG3, data "0" (=0V) can be transferred to the channel of the selected memory cell while maintaining the channel potential (write inhibit potential) of the unselected memory cells. Hence, "0"-programming is executed as usual for the selected memory cell.

Fifth Embodiment

The write scheme of this embodiment is implemented by combining the write scheme (FIG. 8) according to the above-described first embodiment and the write scheme (FIG. 11) according to the above-described third embodiment.

The write scheme according to this embodiment will be described using the NAND flash memory shown in FIGS. 6 and 7 as an example.

Assumptions are that a word line WL2 shown in FIG. 7 is selected, of the memory cells connected to the word line WL2, a memory cell A indicated by a broken line is the selected cell (cell to be subjected to "0"-programming), and the remaining memory cells are unselected cells (cells to be subjected to "1"-programming, i.e., write inhibit cell).

Figure 13:
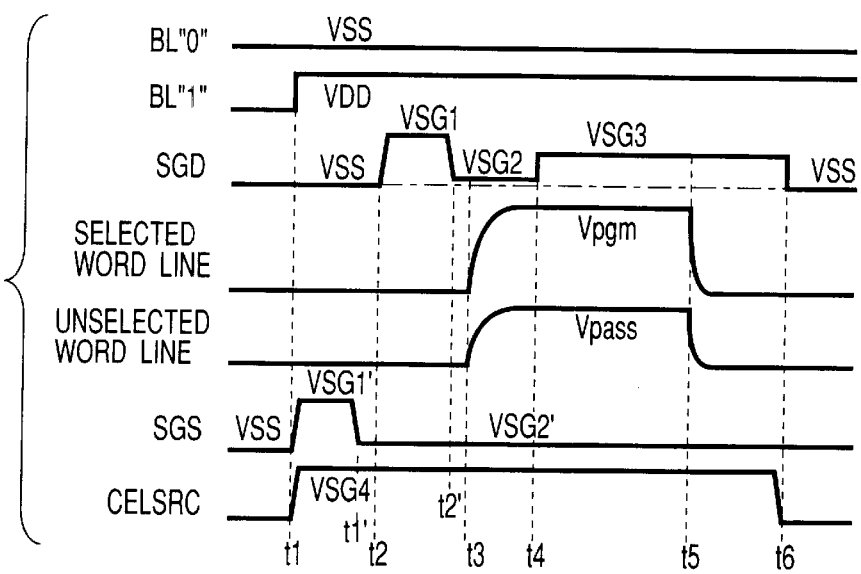
FIG. 13 is a waveform chart showing a write scheme according to the fifth embodiment of the present invention.

FIG. 13 is a waveform chart showing signal waveforms of the write scheme according to the fifth embodiment of the present invention.

First, write data of one page are input from the outside of the chip to sense amplifiers S/A (data load).

Since "0"-programming (write operation for increasing the threshold value) is to be executed only for the memory cell A, data "1" is input to the sense amplifier S/A connected to a selected bit line BL2, and data "1" is input to the sense amplifiers S/A connected to remaining bit lines BL0, BL1, BL3, and BL4.

Each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 13, BL"0" represents the bit line BL2 connected to the memory cell A to be subjected to "1"-programming, and "1" represents the bit lines BL0, BL1, BL3, and BL4 connected to cells (write inhibit cells) to be subjected to "1"-programming.

In the write operation, first, a source line potential CELSRC is set to VSL4, and a source-side select gate line SGS is set to VSG1'. The potential VSL4 is equal to or higher than, e.g., an internal power supply potential VDD, like a potential Vread. The potential VSG1' is set to be equal to VSL4 or equal to or more than a value obtained by adding a threshold value Vth of the source-side select gate transistor to the potential VSL4.

Thus, the potential VSL4 is transferred from the source line to the cell units through the source-side select gate transistors (time t1).

At this time, the potentials of all word lines (selected and unselected word lines) in the selected block selected by the block address may be set to Vread. In this case, all memory cells can be turned on independently of the data patterns, i.e., the states ("0" or "1") of the memory cells, and the channels of memory cells in all cell units in the selected block can be charged to VSL4.

Simultaneously, a control signal BLTR changes to "H" level (potential capable of sufficiently transferring the power supply potential VDD) to transfer the data in the sense amplifiers S/A to the bit lines BLj (j=0, 1, ... ). That is, the bit line BL2 connected to the sense amplifier S/A with the data "0" changes to "0" ("L" level=0V), and the bit lines BL0, BL1, BL3, and BL4 connected to the sense amplifiers S/A with the data "1" change to "1" ("H" level=VDD).

However, the potentials of the bit lines are not transmitted to the cell units because a drain-side select gate line SGD is set to 0V, and the drain-side select gate transistors are always kept off.

After this, before a program potential Vpgm and intermediate potential Vpass are applied, the potential of the source-side select gate line SGS is dropped from VSG1' to VSG2' (time t1').

The potential VSG2' is set to a value that satisfies the following conditions: the source-side select gate transistors in the cell units connected to the unselected bit lines are always kept cut off, charges accumulated in the channels of memory cells in the cell units do not leak, and the channel potential (write inhibit potential) does not drop.

After that, the drain-side select gate line SGD is set to VSG1 (time t2).

In the write scheme according to the present invention, the potential VSG1 is set to a potential (e.g., potential equal to or higher than the power supply potential VDD) that can sufficiently transfer the data "1" (=VDD) of the unselected bit lines BL0, BL1, BL3, and BL4, i.e., write inhibit potential (initial potential) through the drain-side select gate line SGD without, e.g., any threshold voltage drop.

At this time, the potentials of all word lines (selected and unselected word lines) in the selected block selected by the block address may be set to Vread. In this case, all memory cells can be turned on independently of the data patterns, i.e., the states ("0" or "1") of the memory cells, and the channels of memory cells in all cell units in the selected block can be charged to a predetermined value corresponding to the data of the bit line.

In this embodiment, it is effective when all word lines in the selected block are at 0V, and the cell units include memory cells in the "0" state during the period from the time t1 to t3. In this case, since the memory cells in the "0" state in the cell units are turned off, charging the channels from both sides (source and drain sides) of the cell units is very convenient to obtain a sufficiently high write inhibit potential.

After this, before the program potential Vpgm and intermediate potential Vpass are applied, the potential of the drain-side select gate line SGD is dropped from VSG1 to VSG2 (time t2').

The potential VSG2 is set to a value (e.g., 0V) that satisfies the following conditions: the drain-side select gate transistors in the cell units connected to the unselected bit lines are always kept cut off, charges accumulated in the channels of memory cells in the cell units do not leak, and the channel potential (write inhibit potential) does not drop.

After that, in the selected block, the program potential Vpgm is applied to the selected word line WL2, and the intermediate potential Vpass (0<Vpass<Vpgm) is applied to the unselected word lines WL0, WL1, and WL3 (time t3).

At this time, the source-side select gate line SGS is set to the sufficiently low potential VSG2', and the drain-side select gate line SGD is also set to the sufficiently low potential VSG2 (e.g., VSS). For example, even when the program potential Vpgm and intermediate potential Vpass are applied to the word lines, and the potentials of the source- and drain-side select gate lines SGS and SGD increase due to capacitive coupling, the source- and drain-side select gate transistors are not turned on.

Hence, any leakage of the channel potential can be prevented when the program potential Vpgm and intermediate potential Vpass are applied, and after channel boost, a sufficiently high write inhibit potential can be obtained.

In the write scheme of the present invention, in applying the program potential Vpgm and intermediate potential Vpass, the source-side select gate line SGS is set to the sufficiently small value VSG2', and the source-side select gate transistors are in the cut-off state. Since the drain-side select gate line SGD is also set to the sufficiently small value VSG2, the drain-side select gate transistors are also in the cut-off state.

Hence, in applying the program potential Vpgm and intermediate potential Vpass, i.e., at the time of channel boost, the channels of memory cells in all cell units in the selected block are boosted.

After that, the potential of the drain-side select gate line SGD is raised from VSG2 to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channels of all memory cells in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0V), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL2, "0"-programming (write operation for increasing the threshold value) is executed for the selected memory cell A, and "1"-programming (write operation for maintaining the "1" state) is executed for the remaining unselected memory cells.

After that, the potential Vpgm of the selected word line WL2 and the potential Vpass of the unselected word lines WL0, WL1, and WL3 are reduced to 0V (time t5). Next, the potential VSG3 of the drain-side select gate line SGD is reduced to 0V (time t6), thereby ending the write operation.

For example, VSG1 and VSG1 are set to a potential VDD+Vth or more, VSG2 is set to 0V, and VSG3 and VSL4 are set to VDD. VDD is the internal power supply potential which is the write inhibit potential (initial potential) to be transferred to the channels of the memory cells. Vth is the threshold value of the drain-side or the source-side select gate transistor.

The write scheme according to the fifth embodiment of the present invention has been described above in detail. The characteristic features will be summarized below.

Step 1 (Time t1)

The source-side select gate line SGS is set to VSG1', and the source line CELSRC is set to VSL4 to sufficiently transfer the potential VSL4 of the source line CELSRC to the cell units in the selected block (e.g., the potential VSL4 without any threshold voltage drop).

Step 2 (Time t1')

The potential of the source-side select gate line SGS is dropped from VSG1 to VSG2 to set the source-side select gate transistors in all cell units in the selected block in the cut-off state.

Step 3 (Time t2)

The drain-side select gate line SGD is set to VSG1 to sufficiently transfer a predetermined potential corresponding to the data of the bit line to the cell units in the selected block (e.g., the potential VDD or VSS without any threshold voltage drop).

Step 4 (Time t2')

The potential of the drain-side select gate line SGD is dropped from VSG1 to VSG2 to set the source-side select gate transistors in all cell units in the selected block in the cut-off state.

Step 5 (Time t3)

The program potential Vpgm and intermediate potential Vpass are applied to the word lines to boost the channel potentials of memory cells in all cell units in the selected block by capacitive coupling. The channels of memory cells in the cell units connected to the unselected bit lines are set to a sufficiently high write inhibit potential.

Step 6 (Time t4)

The potential of the drain-side select gate line SGD is raised from VSG2 to VSG3 to turn on the drain-side select gate transistor in the cell unit connected to the selected bit line and set the channel potential of the memory cells in the cell unit connected to the selected bit line to 0V. Thus, "0"-programming is executed for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in applying the program potential, the source-side select gate line SGS is set to VSG2', and the drain-side select gate line SGD is set to VSG2.

Hence, in applying the program potential Vpgm, even when the potentials of the two select gate lines SGS and SGD slightly increase due to capacitive coupling, the select gate transistors in the selected block are not turned on. That is, in applying the program potential Vpgm, the select gate transistors do not cause any leakage, and a sufficiently high write inhibit potential can be obtained.

The value VSG1' is determined aiming at sufficiently transferring the potential VSL4 of the source line CELSRC to the cell units (charging the cell units with a high initial potential). The value VSG1 is determined aiming at sufficiently transferring a predetermined potential corresponding to the data of the bit line to the cell units (charging the cell units with a high initial potential). The values VSG2' and VSG2 are determined aiming at preventing the source- and drain-side select gate transistors from being turned on (preventing leakage) even when the potentials VSG2' and VSG2 increase due to capacitive coupling at the time of application of the program potential Vpgm. The value VSG3 is determined aiming at transferring 0V to the channels of memory cells in the cell unit connected to the selected bit line and, for the channels of memory cells in the cell units connected to the unselected bit lines, keeping the sufficiently high channel potential (write inhibit potential) after boost.

To simultaneously achieve these purposes, VSG1>VSG3>VSG2 and VSG1'≧VSG4≧VDD are satisfied.

In the write scheme according to this embodiment, VSG1=VSG1'=VSL4 may hold. As an important point of this embodiment, at the time of channel boost, the source-side select gate line SGS is set to VSG2', and the drain-side select gate line SGD is set to VSG2 (e.g., 0V). In this case, the channels of all memory cells in the cell units in the selected block are boosted independently of the program data.

As described above, according to the write scheme of the present invention, the channels are charged from both sides (source and drain sides) of the cell units. For this reason, even when cells in the "0" state are present in the cell units, a sufficiently high initial potential can be obtained before channel boost. Additionally, at the time of channel boost (at the time of application of the program potential Vpgm), the gate potentials of the select gate transistors are set to VSG2' and VSG2, thereby preventing leakage in channel boost.

Before the program potential Vpgm is applied, the word line potential is set not to Vread but to 0V. For this reason, the potential difference to be applied to the word lines at the time of channel boost can be made high, and the potential increase by channel boost can be made large.

Hence, for the channels of the unselected memory cells (write inhibit cells), a sufficiently high write inhibit potential can be obtained by channel boost, and consequently, any erratic program can be prevented, and the reliability can be improved.

When the gate potential of the drain-side select gate transistors is changed from VSG2 to VSG3, data "0" (=0V) can be transferred to the channel of the selected memory cell while maintaining the channel potential (write inhibit potential) of the unselected memory cells. Hence, "0"-programming is executed as usual for the selected memory cell.

Sixth Embodiment

The write scheme of this embodiment is a modification to the write scheme of the above-described fifth embodiment (FIG. 13). As a characteristic feature of the write scheme of the sixth embodiment, the timing of channel charging from the source side and the timing of channel charging from the drain side are reversed.

The write scheme according to this embodiment will be described using the NAND flash memory shown in FIGS. 6 and 7 as an example.

Assumptions are that a word line WL2 shown in FIG. 7 is selected, of the memory cells connected to the word line WL2, a memory cell A indicated by a broken line is the selected cell (cell to be subjected to "0"-programming), and the remaining memory cells are unselected cells (cells to be subjected to "1"-programming, i.e., write inhibit cell).

Figure 14:
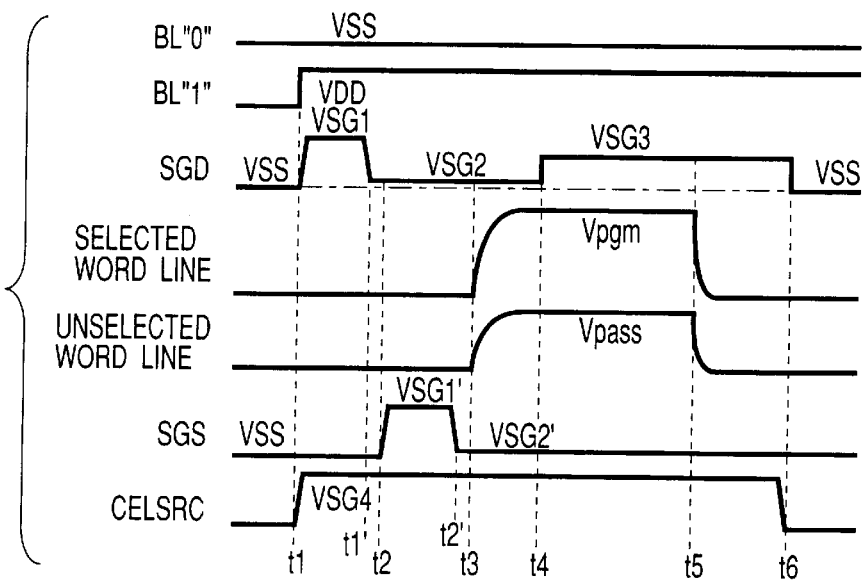
FIG. 14 is a waveform chart showing a write scheme according to the sixth embodiment of the present invention.

FIG. 14 is a waveform chart showing signal waveforms of the write scheme according to the sixth embodiment of the present invention.

First, write data of one page are input from the outside of the chip to sense amplifiers S/A (data load).

Since "0"-programming (write operation for increasing the threshold value) is to be executed only for the memory cell A, data "0" is input to the sense amplifier S/A connected to a selected bit line BL2, and data "1" is input to the sense amplifiers S/A connected to remaining bit lines BL0, BL1, BL3, and BL4.

Each sense amplifier S/A has a latch function (latch circuit) for temporarily storing write data. The sense amplifier S/A connected to the selected bit line BL2 latches the data "0", and the sense amplifiers S/A connected to the bit lines BL0, BL1, BL3, and BL4 latch the data "1".

Referring to the signal waveform chart of FIG. 14, BL"0" represents the bit line BL2 connected to the memory cell A to be subjected to "0"-programming, and BL"1" represents the bit lines BL0, BL1, BL3, and BL4 connected to cells (write inhibit cells) to be subjected to "1"-programming.

In the write operation, first, a control signal BLTR changes to "H" level (potential capable of sufficiently transferring a power supply potential VDD) to transfer the data in the sense amplifiers S/A to the bit lines BLj (j=0, 1, ... ). That is, the bit line BL2 connected to the sense amplifier S/A with the data "0" changes to "0" ("L" level=0V), and the bit lines BL0, BL1, BL3, and BL4 connected to the sense amplifiers S/A with the data "1" change to "1" ("H" level= VDD).

In addition, a drain-side select gate line SGD is set to VSG1 (time t1).

In the write scheme according to the present invention, the potential VSG1 is set to a potential (e.g., potential equal to or higher than the power supply potential VDD) that can sufficiently transfer the data "1" (=VDD) of the unselected bit lines BL0, BL1, BL3, and BL4, i.e., write inhibit potential (initial potential) through the drain-side select gate line SGD without, e.g., any threshold voltage drop.

After this, before a program potential Vpgm and intermediate potential Vpass are applied, the potential of the drain-side select gate line SGD is dropped from VSG1 to VSG2 (time t1'). The potential VSG2 is set to a value (e.g., 0V) with which the drain-side select gate transistors in the cell units connected to the unselected bit lines are always kept cut off, charges accumulated in the channels of memory cells in the cell units do not leak, and the channel potential (write inhibit potential) does not drop.

After that, the source-side select gate line SGS is set to VSG1'. A source line CELSRC is set to VSL4 in advance at the time t1. The potential VSL4 is equal to or higher than, e.g., the internal power supply potential VDD, like a potential Vread. The potential VSG1' is set to be equal to VSL4 or equal to or more than a value obtained by adding a threshold value Vth of the source-side select gate transistor to the potential VSL4.

Thus, the potential VSL4 is transferred from the source line to the cell units through the source-side select gate transistors (time t2).

After this, before the program potential Vpgm and intermediate potential Vpass are applied, the potential of the source-side select gate line SGS is dropped from VSG1' to VSG2' (time t2').

The potential VSG2' is set to a value that satisfies the following conditions: the source-side select gate transistors in the cell units connected to the unselected bit lines are always kept cut off, charges accumulated in the channels of memory cells in the cell units do not leak, and the channel potential (write inhibit potential) does not drop.

After that, in the selected block, the program potential Vpgm is applied to the selected word line WL2, and the intermediate potential Vpass (0<Vpass<Vpgm) is applied to the unselected word lines WL0, WL1, and WL3 (time t3).

At this time, the source-side select gate line SGS is set to the sufficiently low potential VSG2', and the drain-side select gate line SGD is also set to the sufficiently low potential VSG2 (e.g., VSS). For example, even when the program potential Vpgm and intermediate potential Vpass are applied to the word lines, and the potentials of the source- and drain-side select gate lines SGS and SGD increase due to capacitive coupling, the source- and drain-side select gate transistors are not turned on.

Hence, any leakage of the channel potential can be prevented when the program potential Vpgm and intermediate potential Vpass are applied, and after channel boost, a sufficiently high write inhibit potential can be obtained.

In the write scheme of the present invention, in applying the program potential Vpgm and intermediate potential Vpass, the source-side select gate line SGS is set to the sufficiently small value VSG2', and the source-side select gate transistors are in the cut-off state. Since the drain-side select gate line SGD is also set to the sufficiently small value VSG2, the drain-side select gate transistors are also in the cut-off state.

Hence, in applying the program potential Vpgm and intermediate potential Vpass, i.e., at the time of channel boost, the channels of memory cells in all cell units in the selected block are boosted.

After that, the potential of the drain-side select gate line SGD is raised from VSG2 to VSG3 (time t4).

For the cell unit connected to the selected bit line BL2, the potential VSG3 is set to a value with which the drain-side select gate transistor is turned on, and data "0" (=0V) of the selected bit line BL2 can be transferred to the channels of all memory cells in the cell unit. For the cell units connected to the unselected bit lines BL0, BL1, BL3, and BL4, the potential VSG3 is set to a value with which the drain-side select gate transistors are kept cut off, and the channel potential (write inhibit potential) of the memory cells in the cell units can be maintained.

The potential VSG3 is set such that VSG1>VSG3>VSG2 is satisfied.

Consequently, since the channels of memory cells in the cell unit connected to the selected bit line BL2 are at "0" (0V), an electric field sufficient for the write (increase in threshold value by tunnelling) is applied across the channel and control gate electrode of the selected memory cell A. On the other hand, since the channels of memory cells in the cell units connected to the unselected bit lines BL0, BL1, BL3, and BL4 keep the sufficiently high write inhibit potential, no electric field sufficient for the write is applied across the channel and control gate electrode of each write inhibit cell.

With this operation, in the memory cells of one page connected to the selected word line WL2, "0"-programming (write operation for increasing the threshold value) is executed for the selected memory cell A, and "1"-programming (write operation for maintaining the "1" state) is executed for the remaining unselected memory cells.

After that, the potential Vpgm of the selected word line WL2 and the potential Vpass of the unselected word lines WL0, WL1, and WL3 are reduced to 0V (time t5). Next, the potential VSG3 of the drain-side select gate line SGD is reduced to 0V (time t6), thereby ending the write operation.

For example, VSG1 is set to a potential VDD+Vth or more, VSG2 is set to 0V, and VSG3 and VSL4 are set to the voltage Vread higher than VDD. VDD is the internal power supply potential which is the write inhibit potential (initial potential) to be transferred to the channels of the memory cells. Vth is the threshold value of the drain-side or the source-side select gate transistor.

The write scheme according to the sixth embodiment of the present invention has been described above in detail. The characteristic features will be summarized below.

Step 1 (Time t1)

The drain-side select gate line SGD is set to VSG1 to sufficiently transfer a predetermined potential corresponding to the data of the bit line to the cell units in the selected block (e.g., the potential VDD or VSS without any threshold voltage drop).

Step 2 (Time t1')

The potential of the drain-side select gate line SGD is dropped from VSG1 to VSG2 to set the source-side select gate transistors in all cell units in the selected block in the cut-off state.

Step 3 (Time t2)

The source-side select gate line SGS is set to VSG1, and the source line CELSRC is set to VSL4 to sufficiently transfer the potential VSL4 of the source line CELSRC to the cell units in the selected block (e.g., the potential VSL4 without any threshold voltage drop).

Step 4 (Time t2')

The potential of the source-side select gate line SGS is dropped from VSG1' to VSG2' to set the source-side select gate transistors in all cell units in the selected block in the cut-off state.

Step 5 (Time t3)

The program potential Vpgm and intermediate potential Vpass are applied to the word lines to boost the channel potentials of memory cells in all cell units in the selected block by capacitive coupling. The channels of memory cells in the cell units connected to the unselected bit lines are set to a sufficiently high write inhibit potential.

Step 6 (Time t4)

The potential of the drain-side select gate line SGD is raised from VSG2 to VSG3 to turn on the drain-side select gate transistor in the cell unit connected to the selected bit line and set the channel potential of the memory cells in the cell unit connected to the selected bit line to 0V. Thus, "0"-programming is executed for the selected memory cell connected between the selected word line and the selected bit line.

At this time, the drain-side select gate transistors in the cell units connected to the unselected bit lines are kept cut off, and the channels of memory cells in the cell units connected to the unselected bit lines maintain the write inhibit potential.

As described above, in the write scheme according to the present invention, in applying the program potential, the source-side select gate line SGS is set to VSG2', and the drain-side select gate line SGD is set to VSG2. For example, both the two select gate lines SGS and SGD in the selected block are set to VSS (=0V).

Hence, in applying the program potential Vpgm, even when the potentials of the two select gate lines SGS and SGD slightly increase due to capacitive coupling, the select gate transistors in the selected block are not turned on. That is, in applying the program potential Vpgm, the select gate transistors do not cause any leakage, and a sufficiently high write inhibit potential can be obtained.

The value VSG1' is determined aiming at sufficiently transferring the potential VSL4 of the source line CELSRC to the cell units (charging the cell units with a high initial potential). The value VSG1 is determined aiming at sufficiently transferring a predetermined potential corresponding to the data of the bit line to the cell units (charging the cell units with a high initial potential).

The values VSG2' and VSG2 are determined aiming at preventing the source- and drain-side select gate transistors from being turned on (preventing leakage) even when the potentials VSG2 and VSG2 increase due to capacitive coupling at the time of application of the program potential Vpgm. The value VSG3 is determined aiming at transferring 0V to the channels of memory cells in the cell unit connected to the selected bit line and, for the channels of memory cells in the cell units connected to the unselected bit lines, keeping the sufficiently high channel potential (write inhibit potential) even after boost.

To simultaneously achieve these purposes, VSG1>VSG3>VSG2 and VSG1'≧VSL4≧VDD are satisfied.

In the write scheme according to this embodiment, VSG1=VSG1'=VSL4 may hold. As an important point of this embodiment, at the time of channel boost, the source-side select gate line SGS is set to VSG2', and the drain-side select gate line SGD is set to VSG2 (e.g., 0V). In this case, the channels of all memory cells in the cell units in the selected block are boosted independently of the program data.

As described above, according to the write scheme of the present invention, the channels are charged from both sides (source and drain sides) of the cell units. For this reason, even when cells in the "0" state are present in the cell units, a sufficiently high initial potential can be obtained before channel boost. Additionally, at the time of channel boost (at the time of application of the program potential Vpgm), the gate potentials of the select gate transistors are set to VSG2' and VSG2, thereby preventing leakage in channel boost.

Before the program potential Vpgm is applied, the word line potential is set not to Vread but to 0V. For this reason, the potential differences to be applied to the word lines at the time of channel boost can be made high, and the potential increase by channel boost can be made large.

Hence, for the channels of the unselected memory cells (write inhibit cells), a sufficiently high write inhibit potential can be obtained by channel boost, and consequently, any erratic program can be prevented, and the reliability can be improved.

When the gate potential of the drain-side select gate transistors is changed from VSG2 to VSG3, data "0" (=0V) can be transferred to the channel of the selected memory cell while maintaining the channel potential (write inhibit potential) of the unselected memory cells. Hence, "0"-programming is executed as usual for the selected memory cell.

Seventh Embodiment

The write scheme of this embodiment is a modification to the write scheme of the above-described second embodiment (FIG. 10). The write scheme of the seventh embodiment is applied to a 3Tr-NAND. As a characteristic feature, the timing to raise the potential of a drain-side select gate line SGD from VSG2 to VSG3 is set before the timing to apply a program potential Vpgm, unlike the write scheme according to the above-described second embodiment.

Figure 15:
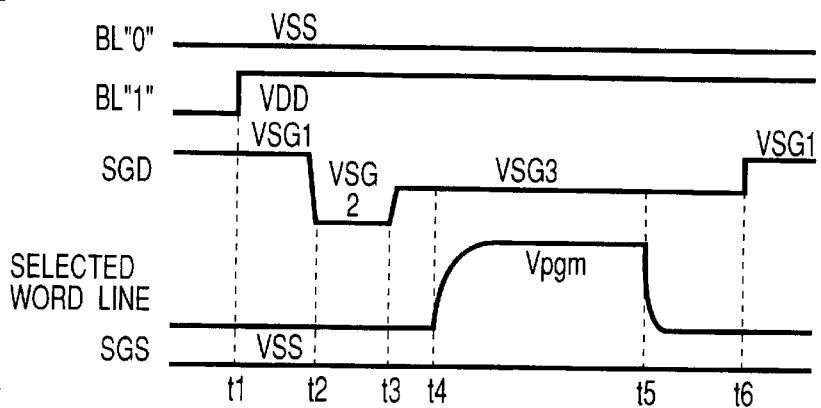
FIG. 15 is a waveform chart showing a write scheme according to the seventh embodiment of the present invention.

FIG. 15 is a waveform chart showing the write scheme according to the seventh embodiment of the present invention.

As shown in this signal waveform chart, the potential of the drain-side select gate line SGD rises from VSG2 to VSG3 at time t3. After that, at time t4, the program potential Vpgm is applied to the word lines in the selected block.

In the write scheme according to this embodiment, when the program potential Vpgm is applied to the word lines in the selected block, the drain-side select gate line SGD is set to VSG3 higher than VSG2.

However, when the value VSG3 is set to be sufficiently small, like VSG2, the potential of the drain-side select gate line SGD can be prevented from rising due to capacitive coupling, and the drain-side select gate transistors are prevented from being turned on when the program potential Vpgm is applied. That is, VSG3 is set to a value that prevents any leakage current to the drain-side select gate transistors when the program potential Vpgm is applied (when the word lines rise).

Additionally, in the write scheme of this embodiment, before the program potential Vpgm is applied to the word lines in the selected block, the drain-side select gate line SGD is set to VSG3 higher than VSG2 to transfer a potential corresponding to the data of the bit line to the cell units. That is, after the program potential Vpgm is applied to the word lines in the selected block, the potential of the bit line is not changed after the Vpgm is applied to the bit line.

In this case, in transferring the potential corresponding to the data of the bit line to the cell units, the write inhibit potential can be prevented from dropping due to capacitive coupling between the cell units.

More specifically, when the program potential Vpgm is applied to the word lines in the selected block, and then the potential corresponding to the data of the bit line is transferred to the cell units, the channels of unselected memory cells are boosted to the write inhibit potential, and then, 0V is transferred to the channel of the selected memory cell. Hence, when 0V is transferred to the channel of the selected memory cell, the channel potential (write inhibit potential) of the unselected memory cells may drop due to capacitive coupling between adjacent cell units.

However, when the potential corresponding to the data of the bit line is transferred to the cell units before the program potential Vpgm is applied to the word lines in the selected block, only the channels of the unselected memory cells are boosted to the write inhibit potential in channel boost. In addition, since the channel of the selected memory cell has already been set to 0V, the potential of the bit line is not change after channel boost. Hence, the channel potential (write inhibit potential) of the unselected memory cells do not drop due to capacitive coupling between adjacent cell units.

Eighth Embodiment

The write scheme of this embodiment is a modification to the write scheme of the above-described first embodiment (FIG. 8). The write scheme of the eighth embodiment is applied to a NAND flash memory. As a characteristic feature, the timing to raise the potential of a drain-side select gate line SGD from VSG2 to VSG3 is set before the timing to apply a program potential Vpgm, unlike the write scheme according to the above-described first embodiment.

Figure 16:
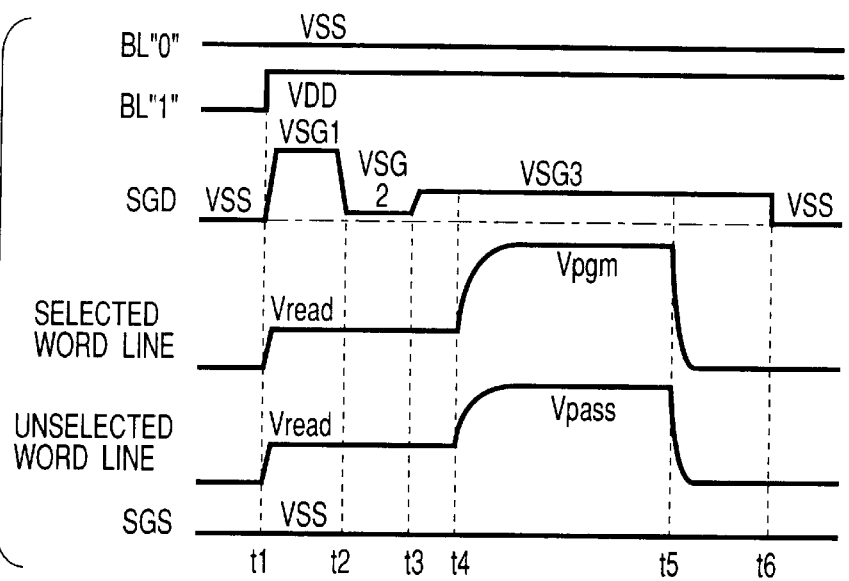
FIG. 16 is a waveform chart showing a write scheme according to the eighth embodiment of the present invention.

FIG. 16 is a waveform chart showing the write scheme according to the eighth embodiment of the present invention.

As shown in this signal waveform chart, the potential of the drain-side select gate line SGD rises from VSG2 to VSG3 at time t3. After that, at time t4, the program potential Vpgm is applied to the word lines in the selected block.

In the write scheme according to this embodiment, when the program potential Vpgm is applied to the word lines in the selected block, the drain-side select gate line SGD is set to VSG3 higher than VSG2.

However, when the value VSG3 is set to be sufficiently small, like VSG2, the potential of the drain-side select gate line SGD can be prevented from rising due to capacitive coupling, and the drain-side select gate transistors are prevented from being turned on when the program potential Vpgm is applied. That is, VSG3 is set to a value that prevents any leakage current to the drain-side select gate transistors when the program potential Vpgm is applied (when the word lines rise).

Additionally, in the write scheme of this embodiment, before the program potential Vpgm is applied to the word lines in the selected block, the drain-side select gate line SGD is set to VSG3 higher than VSG2 to transfer a potential corresponding to the data of the bit line to the cell units. That is, after the program potential Vpgm is applied to the word lines in the selected block, the potential of the bit line is not changed after the Vpgm is applied to the bit line.

In this case, in transferring the potential corresponding to the data of the bit line to the cell units, the write inhibit potential can be prevented from dropping due to capacitive coupling between the cell units.

More specifically, when the program potential Vpgm is applied to the word lines in the selected block, and then the potential corresponding to the data of the bit line is transferred to the cell units, the channels of unselected memory cells are boosted to the write inhibit potential, and then, 0V is transferred to the channel of the selected memory cell. Hence, when 0V is transferred to the channel of the selected memory cell, the channel potential (write inhibit potential) of the unselected memory cells may drop due to capacitive coupling between adjacent cell units.

However, when the potential corresponding to the data of the bit line is transferred to the cell units before the program potential Vpgm is applied to the word lines in the selected block, only the channels of the unselected memory cells are boosted to the write inhibit potential in channel boost. In addition, since the channel of the selected memory cell has already been set to 0V, the potential of the bit line is not change after channel boost. Hence, the channel potential (write inhibit potential) of the unselected memory cells do not drop due to capacitive coupling between adjacent cell units.

Ninth Embodiment

Figure 17:
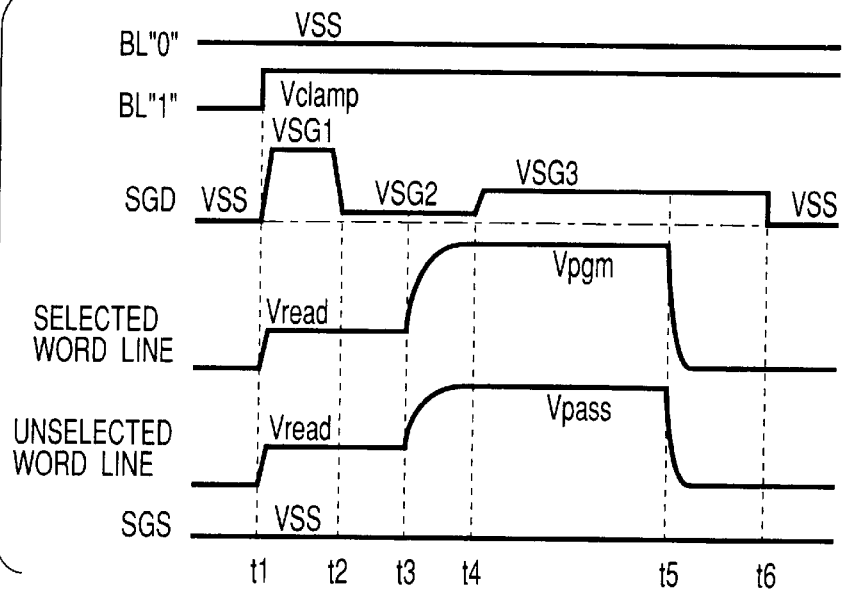
FIG. 17 is a waveform chart showing a write scheme according to the ninth embodiment of the present invention.

FIG. 17 is a waveform chart showing a write scheme according to the ninth embodiment of the present invention.

The signal waveforms are almost the same as those (FIG. 8) of the write scheme according to the above-described first embodiment.

The signal waveforms of the write scheme according to the ninth embodiment are different from those of the write scheme according to the above-described first embodiment only in the potential level of an unselected bit line BL"1".

More specifically, in the above-described first embodiment, the unselected bit line BL"1" is set to an internal power supply potential VDD. In the ninth embodiment, the unselected bit line BL"1" is set to a clamp potential Vclamp (e.g., about 2V) lower than the internal power supply potential VDD.

When the potential level of the unselected bit line BL"1" is lowered, the load in charging due to the bit line capacitance or capacitance between bit lines, that increases as the device becomes compact and the capacity becomes large, can be reduced. That is, the potential level of the unselected bit line BL"1" can be effectively lowered to reduce power consumption and fluctuation in power supply potential.

The clamp potential Vclamp will be examined here.

The clamp potential Vclamp at the unselected bit line BL"1" is a charge potential applied to the channel of an unselected memory cell to inhibit the write.

The charge potential of a channel is determined by the transfer potential that is defined by the threshold value of a "0" cell in the cell unit and the gate potential of the "0" cell. For this reason, the potential Vclamp is set to be higher than the transfer potential. For example, the gate potential of the "0" cell is Vread (e.g., 3.5V). When the threshold value of the "0" cell is 1.5V, the "0" cell can transfer only a potential equal to or lower than 2.0V (=3.5V–1.5V).

Hence, the potential Vclamp is set to be 2.0V or more.

Actually, the threshold value of the "0" cell has a distribution from 0.5V to 2.0V, so a "0" cell having a threshold value of 0.5V with which the channel potential (write inhibit potential) is maximized is preferably examined. In the write, the back gate bias effect is also present. When this effect is also taken into consideration, the threshold value of the "0" cell can be assumed to be 1.5V.

When the threshold value of the "0" cell is 1.5V, it is effective to set the potential Vclamp to 2.0V or more, as described above.

In the above-described first to eighth embodiments, VSG3 can be set to the internal power supply potential VDD.

In the ninth embodiment, however, VSG3 must be a potential between Vclamp and the threshold value of the drain-side select gate transistor (both inclusive). This is because the unselected bit line BL"1" has the clamp potential Vclamp in this embodiment. In this case, when VSG3 is equal to the internal power supply potential VDD, the potential relationship in the drain-side select gate transistor is Vg (gate)=VDD, Vs (source)=Vboost (channel boost potential), and Vd (drain)=Vclamp. when VDD>Vclamp, charges in the channel are removed to the bit line through the drain-side select gate transistor.

To prevent this, in the ninth embodiment, VSG3 is set to be a potential between Vclamp and the threshold value of the drain-side select gate transistor (both inclusive).

In the ninth embodiment, the unselected bit line BL"1" is set to the clamp potential Vclamp lower than the internal power supply potential VDD on the basis of the above-described first embodiment.

Setting the unselected bit line BL"1" to the clamp potential Vclamp lower than the internal power supply potential VDD can also be applied to the write schemes according to the above-described second to eighth embodiments. In this case as well, the same effect as that of the ninth embodiment can be obtained.

Tenth Embodiment

Figure 18:
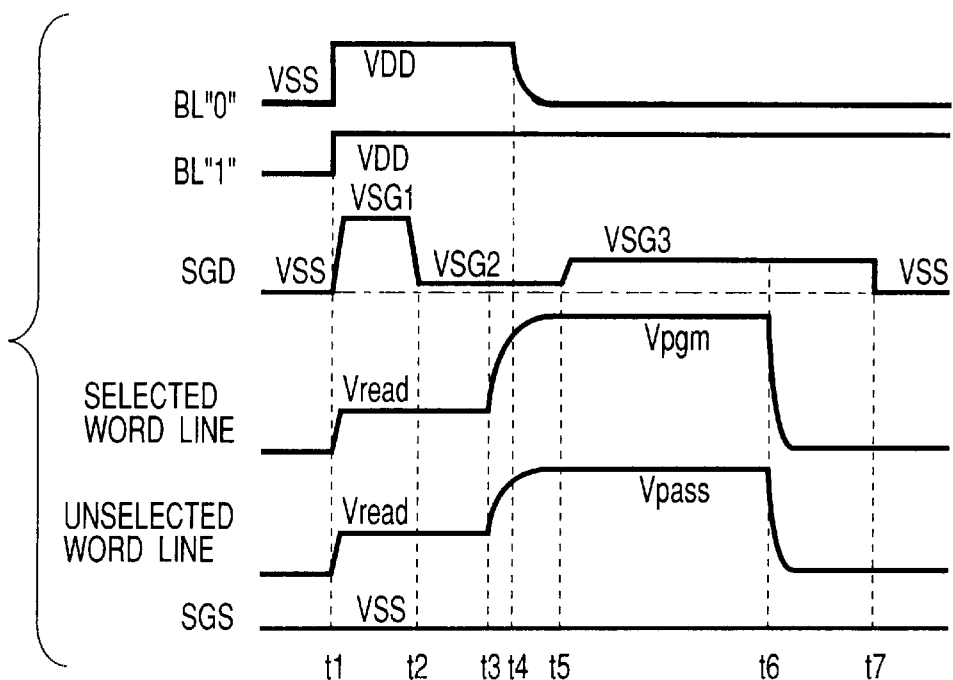
FIG. 18 is a waveform chart showing a write scheme according to the 10th embodiment of the present invention.

FIG. 18 is a waveform chart showing a write scheme according to the 10th embodiment of the present invention.

The signal waveforms are almost the same as those (FIG. 8) of the write scheme according to the above-described first embodiment.

The signal waveforms of the write scheme according to the 10th embodiment are different from those of the write scheme according to the above-described first embodiment only in the signal waveform of a selected bit line BL"0".

More specifically, in the above-described first embodiment, the selected bit line BL"0" is always set to VSS (=0V). In the 10th embodiment, the selected bit line BL"0" is set to an internal power supply potential VDD at least in transferring the initial potential before channel boost to the cell unit (times t1 to t2).

When all bit lines are set to VDD independently of the program data at the time of initial charging, as in this embodiment, the influence of the capacitance between bit lines can be reduced, and initial charging can be performed at a high speed by, e.g., the synergy effect by coupling. When all bit lines are set to VDD, the load capacitance can be effectively decreased to reduce power consumption and fluctuation in power supply.

In this embodiment, the selected bit line BL"0" is set to VSS (=0V) after channel boost is performed by applying a program potential Vpgm. The program data can be transferred to the bit line any time while a drain-side select gate line SGD is at VSG2, i.e., before the drain-side select gate line SGD is set to VSG3 (before the program data is transferred to the cell unit).

For example, the selected bit line BL"0" may be set to VSS (=0V) after channel boost is performed by applying the program potential Vpgm, or simultaneously with or before channel boost by applying the program potential Vpgm, as in this embodiment.

In this embodiment, the selected bit line BL"0" is set to the internal power supply potential VDD at the time of initial charging on the basis of the above-described first embodiment.

Setting the selected bit line BL"0" to the internal power supply potential VDD at the time of initial charging can also be applied to the write schemes according to the above-described second to eighth embodiments. In this case as well, the same effect as that of the 10th embodiment can be obtained.

Eleventh Embodiment

Figure 19:
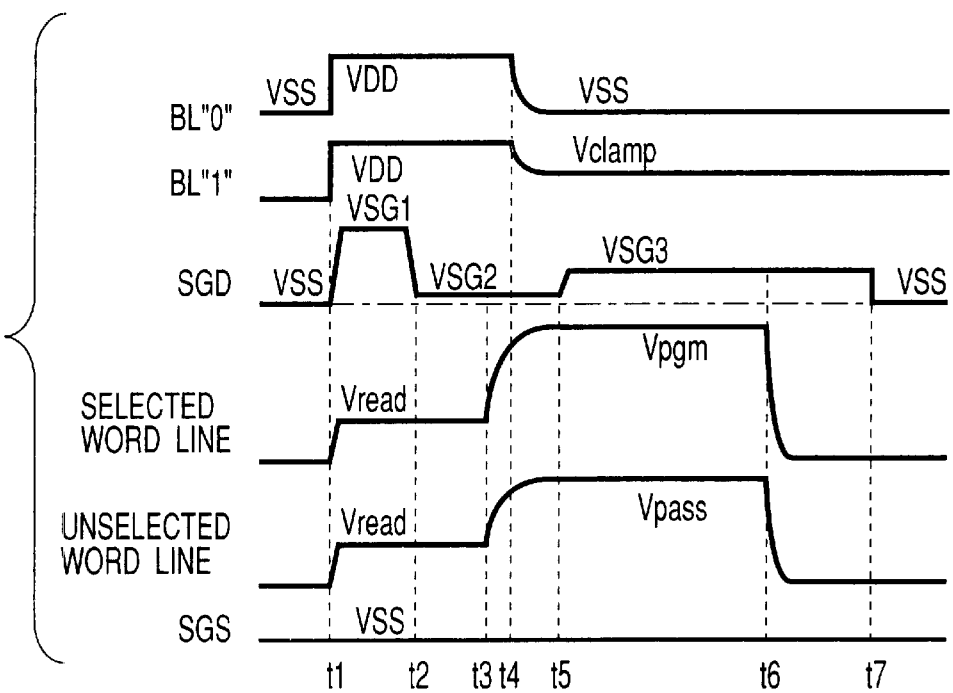
FIG. 19 is a waveform chart showing a write scheme according to the 11th embodiment of the present invention.

FIG. 19 is a waveform chart showing a write scheme according to the 11th embodiment of the present invention.

The signal waveforms are a modification to the write scheme according to the above-described 10th embodiment. The signal waveforms of the write scheme according to the 11th embodiment are different from those of the write scheme according to the above-described 10th embodiment only in the signal waveform of an unselected bit line BL"1".

More specifically, in the 11th embodiment, a selected bit line BL"0" is set to an internal power supply potential VDD at least in transferring the initial potential before channel boost to the cell unit. The unselected bit line BL"1" is also set to the internal power supply potential VDD at least in transferring the initial potential before channel boost to the cell unit (times t1 to t2).

When all bit lines are set to VDD independently of the program data at the time of initial charging, as in this embodiment, the influence of the capacitance between bit lines can be reduced, and initial charging can be performed at a high speed by, e.g., the synergy effect by coupling. When all bit lines are set to VDD, the load capacitance can be effectively decreased to reduce power consumption and fluctuation in power supply.

In this embodiment, the selected bit line BL"0" is set to VSS (=0V) by transfer of program data after channel boost is performed by applying a program potential Vpgm. The unselected bit line BL"1" is set to Vclamp (<VDD) by transfer of program data after channel boost is performed by applying the program potential Vpgm (time t4).

That is, in transferring the data "0" of the selected bit line BL"0" to the cell unit (time t5), the unselected bit line BL"1" is set to Vclamp lower than VDD, and therefore, any delay in data transfer due to capacitive coupling between bit lines can be prevented. According to the 11th embodiment, power consumption can be reduced, and fluctuation in power supply potential VDD can be prevented. Furthermore, the clamp potential Vclamp is set to a value that prevents the channel potential (write inhibit potential) of an unselected memory cell from dropping due to leakage.

In this embodiment, the selected bit line BL"0" is set to VSS (=0V) after channel boost is performed by applying the program potential Vpgm, and the unselected bit line BL"1" is also set to Vclamp after channel boost is performed by applying the program potential Vpgm.

The program data can be transferred to the bit line (the selected bit line BL"0" is set to VSS, and the unselected bit line BL"1" is set to Vclamp) any time while a drain-side select gate line SGD is at VSG2, i.e., before the drain-side select gate line SGD is set to VSG3 (before the program data is transferred to the cell unit).

For example, the bit lines BL"0" and BL"1" may be set to VSS and Vclamp, respectively, after channel boost is performed by applying the program potential Vpgm, or simultaneously with or before channel boost by applying the program potential Vpgm, as in this embodiment.

In the 11th embodiment, VSG3 must be a potential between Vclamp and the threshold value of the drain-side select gate transistor (both inclusive). This is because the unselected bit line BL"1" has the clamp potential Vclamp. In this case, when VSG3 is equal to the internal power supply potential VDD, the potential relationship in the drain-side select gate transistor is Vg (gate)=VDD, Vs (source)= Vboost (channel boost potential), and Vd (drain)=Vclamp. When VDD>Vclamp, charges in the channel are removed to the bit line through the drain-side select gate transistor.

To prevent this, in the 11th embodiment, VSG3 is set to be a potential between Vclamp and the threshold value of the drain-side select gate transistor (both inclusive).

In the 11th embodiment, all bit lines are set to VDD at the time of initial charging, and then, the selected bit line BL"0" is set to VSS, and the unselected bit line BL"1" is set to Vclamp lower than VDD on the basis of the above-described first embodiment.

Such a write scheme can be combined not only with the above-described first embodiment but also with the write schemes according to the above-described second to eighth embodiments. In this case as well, the same effect as that of the 11th embodiment can be obtained.

Others

The write scheme according to the present invention has been described above as the first to 11th embodiments. The present invention is not limited to the NAND flash memory and 3Tr-NAND and can also be applied to any nonvolatile semiconductor memory having a select gate transistor. The write scheme according to the present invention can also be applied not only to a binary (2-level type) memory but also to a multi-level type memory.

Effect of the Invention

As has been described above, according to the present invention, during the period after the initial potential is applied to the cell units until channel boost is ended by applying the program potential to the word lines, a potential that can sufficiently keep the drain- or source-side select gate transistors cut off is applied to the gate electrodes of these select gate transistors. For this reason, the write inhibit potential does not drop due to a leakage current generated at the time of channel boost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
at least one memory cell; and
a select gate transistor connected between a bit line and said at least one memory cell,
wherein write operation is performed during continuous first, second, and third periods, and when gate potentials of said select gate transistor during the first, second, and third periods are represented by first, second, and third potentials, respectively, a relationship given by first potential>third potential>second potential holds.

2. A nonvolatile semiconductor memory comprising:
at least one memory cell; and
two select gate transistors respectively connected to two terminals of said at least one memory cell,
wherein write operation is performed during continuous first, second, and third periods, and when gate potentials of one of said two select gate transistors during the first, second, and third periods are represented by first, second, and third potentials, respectively, a relationship given by first potential>third potential>second potential holds.

3. The memory according to claim 1, wherein the first period is a period when a potential corresponding to program data or a predetermined potential independent of the program data is applied to a channel of said at least one memory cell as an initial potential.

4. The memory according to claim 1, wherein the second period is a period during which said select gate transistor is cut off, a program potential is applied to a selected word line, and a channel potential of said at least one memory cell is boosted.

5. The memory according to claim 1, wherein the third period is a period during which if the bit line has a fourth potential, the fourth potential is transferred to a channel of said at least one memory cell through said select gate transistor, and if the bit line has a fifth potential, said select gate transistor is kept cut off, and a channel potential of said at least one memory cell is maintained.

6. The memory according to claim 1, wherein the second period is a period during which said select gate transistor is kept cut off.

7. The memory according to claim 1, wherein the third period includes a period during which if the bit line has a fourth potential, the fourth potential is transferred to a channel of said at least one memory cell through said select gate transistor, and if the bit line has a fifth potential, said select gate transistor is kept cut off and a channel potential of said at least one memory cell is maintained, and a period during which a program potential is applied to a selected word line and the channel potential of said at least one memory cell is boosted.

8. The memory according to claim 2, wherein the second period is a period during which one of said select gate transistors is cut off and a predetermined potential independent of a program potential is applied to a channel of said at least one memory cell through the other of said select gate transistors.

9. A nonvolatile semiconductor memory, comprising:
at least one memory cell;
a first select gate transistor connected between a bit line and said at least one memory cell; and
a second select gate transistor connected between a source line and said at least one memory cell,
wherein write operation is performed during continuous first, second, third, and fourth periods, and when gate potentials of said first select gate transistor during the first, second, third, and fourth periods are represented by first, second, third, and fourth potentials, respectively, a relationship given by second potential>fourth potential>third potential≧first potential holds.

10. The memory according to claim 9, wherein the first period is a period during which said first select gate transistor is cut off and a predetermined potential independent of a program potential is applied from the source line to a channel of said at least one memory cell through said second select gate transistor.

11. The memory according to claim 9, wherein the second period is a period during which said second select gate transistor is cut off and a potential corresponding to program data or a predetermined potential independent of the program data is applied from the bit line to a channel of said at least one memory cell through said first select gate transistor as an initial potential.

12. The memory according to claim 9, wherein the third period is a period during which said first and second select gate transistors are cut off, a program potential is applied to a selected word line, and a channel potential of said at least one memory cell is boosted.

13. The memory according to claim 9, wherein the fourth period is a period during which if the bit line has a fifth potential, the fifth potential is transferred to a channel of said at least one memory cell through said first select gate transistor, and if the bit line has a sixth potential, said first select gate transistor is kept cut off and a channel potential of said at least one memory cell is maintained.

14. The memory according to claim 9, wherein the third period is a period during which said first and second select gate transistors are kept cut off.

15. The memory according to claim 9, wherein the fourth period includes a period during which if the bit line has a fifth potential, the fifth potential is transferred to a channel of said at least one memory cell through said first select gate transistor, and if the bit line has a sixth potential, said first select gate transistor is kept cut off and a channel potential of said at least one memory cell is maintained, and a period during which a program potential is applied to a selected word line and the channel potential of said at least one memory cell is boosted.

16. A nonvolatile semiconductor memory comprising:
at least one memory cell;
a select gate transistor connected between a bit line and said at least one memory cell; and
a control circuit for setting a gate potential of said select gate transistor to a first potential during a first period for applying an initial potential to a channel of said at least one memory cell, setting the gate potential of said select gate transistor to a second potential during a second period for boosting a channel potential of said at least one memory cell, and setting the gate potential of said select gate transistor to a third potential during a third period for if the bit line has a fourth potential, transferring the fourth potential to the channel of said at least one memory cell, and if the bit line has a fifth potential, maintaining the channel potential of said at least one memory cell,
wherein the first, second, and third periods are continuous, and the first, second, and third potentials have a relationship given by first potential>third potential>second potential.

17. A nonvolatile semiconductor memory comprising:
at least one memory cell;
two select gate transistors respectively connected to two terminals of said at least one memory cell; and
a control circuit for setting a gate potential of one of said select gate transistors to a first potential during a first period for applying an initial potential to a channel of said at least one memory cell, setting the gate potential of one of said select gate transistors to a second potential during a second period for boosting a channel potential of said at least one memory cell, and setting the gate potential of one of said select gate transistors to a third potential during a third period for if the bit line has a fourth potential, transferring the fourth potential to the channel of said at least one memory cell, and if the bit line has a fifth potential, maintaining the channel potential of said at least one memory cell,
wherein the first, second, and third periods are continuous, and the first, second, and third potentials have a relationship given by first potential>third potential>second potential.

18. A nonvolatile semiconductor memory comprising:
at least one memory cell;
a select gate transistor connected between a bit line and said at least one memory cell; and
a control circuit for setting a gate potential of said select gate transistor to a first potential during a first period for applying an initial potential to a channel of said at least one memory cell, setting the gate potential of said select gate transistor to a second potential during a second period for cutting off said select gate transistor, and setting the gate potential of said select gate transistor to a third potential during a third period for if the bit line has a fourth potential, transferring the fourth potential to the channel of said at least one memory cell, and if the bit line has a fifth potential, maintaining a channel potential of said at least one memory cell and then boosting the channel potential of said at least one memory cell,
wherein the first, second, and third periods are continuous, and the first, second, and third potentials have a relationship given by first potential>third potential>second potential.

19. A nonvolatile semiconductor memory comprising:
at least one memory cell;
two select gate transistors respectively connected to two terminals of said at least one memory cell; and
a control circuit for setting a gate potential of one of said select gate transistors to a first potential during a first period for applying an initial potential to a channel of said at least one memory cell, setting the gate potential of one of said select gate transistors to a second potential during a second period for cutting off one of said select gate transistors, and setting the gate potential of one of said select gate transistors to a third potential during a third period for if the bit line has a fourth potential, transferring the fourth potential to the channel of said at least one memory cell, and if the bit line has a fifth potential, maintaining a channel potential of said at least one memory cell and then boosting the channel potential of said at least one memory cell,
wherein the first, second, and third periods are continuous, and the first, second, and third potentials have a relationship given by first potential>third potential>second potential.

20. A nonvolatile semiconductor memory comprising:
at least one memory cell;
two select gate transistors respectively connected to two terminals of said at least one memory cell; and
a control circuit for setting a gate potential of one of said select gate transistors to a first potential, and then setting a gate potential of the other of said select gate transistors to the first potential during a first period for applying an initial potential to a channel of said at least one memory cell, setting the gate potential of one of said select gate transistors to a second potential during a second period for boosting a channel potential of said at least one memory cell, and setting the gate potential of one of said select gate transistors to a third potential during a third period for if the bit line has a fourth potential, transferring the fourth potential to the channel of said at least one memory cell, and if the bit line has a fifth potential, maintaining the channel potential of said at least one memory cell, wherein the first, second, and third periods are continuous, and the first, second, and third potentials have a relationship given by first potential>third potential>second potential.

21. A nonvolatile semiconductor memory comprising:
at least one memory cell;
two select gate transistors respectively connected to two terminals of said at least one memory cell; and
a control circuit for setting a gate potential of one of said select gate transistors to a first potential, and then setting a gate potential of the other of said select gate transistors to the first potential during a first period for applying an initial potential to a channel of said at least one memory cell, setting the gate potential of one of said select gate transistors to a second potential during a second period for cutting off one of said select gate transistors, and setting the gate potential of one of said select gate transistors to a third potential during a third period for if the bit line has a fourth potential, transferring the fourth potential to the channel of said at least one memory cell, and if the bit line has a fifth potential, maintaining a channel potential of said at least one memory cell and then boosting the channel potential of said at least one memory cell,
wherein the first, second, and third periods are continuous, and the first, second, and third potentials have a relationship given by first potential>third potential>second potential.

22. The memory according to claim 20, wherein when the gate potential of one of said select gate transistors is set to the first potential, a predetermined potential independent of program data is applied from a source line to said at least one memory cell through one of said select gate transistors, and when the gate potential of the other of said select gate transistors is set to the first potential, a potential corresponding to the program data is applied from a bit line to said at least one memory cell through the other of said select gate transistors.

23. The memory according to claim 21, wherein when the gate potential of one of said select gate transistors is set to the first potential, a predetermined potential independent of program data is applied from a source line to said at least one memory cell through one of said select gate transistors, and when the gate potential of the other of said select gate transistors is set to the first potential, a potential corresponding to the program data is applied from a bit line to said at least one memory cell through the other of said select gate transistors.

24. The memory according to claim 20, wherein when the gate potential of one of said select gate transistors is set to the first potential, a potential corresponding to program data is applied from a bit line to said at least one memory cell through one of said select gate transistors, and when the gate potential of the other of said select gate transistors is set to the first potential, a predetermined potential independent of the program data is applied from a source line to said at least one memory cell through the other of said select gate transistors.

25. The memory according to claim 21, wherein when the gate potential of one of said select gate transistors is set to the first potential, a potential corresponding to program data is applied from a bit line to said at least one memory cell through one of said select gate transistors, and when the gate potential of the other of said select gate transistors is set to the first potential, a predetermined potential independent of the program data is applied from a source line to said at least one memory cell through the other of said select gate transistors.

26. The memory according to claim 3, wherein the potential corresponding to the program data includes an internal power supply potential and ground potential, and the predetermined potential independent of the program data is a potential not less than the internal power supply potential.

27. The memory according to claim 11, wherein the potential corresponding to the program data includes an internal power supply potential and ground potential, and the predetermined potential independent of the program data is a potential not less than the internal power supply potential.

28. The memory according to claim 1, wherein the first potential has a value larger than that of an internal power supply potential.

29. The memory according to claim 2, wherein the first potential has a value larger than that of an internal power supply potential.

30. The memory according to claim 9, wherein the second potential has a value larger than that of an internal power supply potential.

31. The memory according to claim 1, wherein the third potential is set to a value that can transfer a ground potential and cannot transfer an internal power supply potential or clamp potential.

32. The memory according to claim 2, wherein the third potential is set to a value that can transfer a ground potential and cannot transfer an internal power supply potential or clamp potential.

33. The memory according to claim 9, wherein the fourth potential is set to a value that can transfer a ground potential and cannot transfer an internal power supply potential or clamp potential.

34. The memory according to claim 1, wherein during the first period, a word line of said at least one memory cell is set to a potential that turns on all of said at least one memory cell independently of a data state of said at least one memory cell.

35. The memory according to claim 2, wherein during the first period, a word line of said at least one memory cell is set to a potential that turns on all of said at least one memory cell independently of a data state of said at least one memory cell.

36. A nonvolatile semiconductor memory comprising:
  at least one memory cell; and
  a select gate transistor connected between a bit line and said at least one memory cell,
  wherein at the start of write operation, a write inhibit potential is applied to a channel of said at least one memory cell independently of program data, and then, a potential corresponding to the program data is applied to the channel of said at least one memory cell.

37. The memory according to claim 36, wherein when the program data represents write inhibition, the potential corresponding to the program data has a value smaller than that of the write inhibit potential applied to the channel of said at least one memory cell at the start of write operation.

38. The memory according to claim 36, wherein a program potential is applied to a selected word line after the write inhibit potential is applied to the channel of said at least one memory cell.

39. A nonvolatile semiconductor memory comprising:
  a memory cell; and
  a select gate transistor connected between said memory cell and a source line,
  wherein write operation is performed during continuous first and second periods, and when gate potentials of said select gate transistor during the first and second periods are represented by first and second potentials, respectively, a relationship given by first potential>second potential holds, and during the second period, a program potential is applied to a selected word line.

40. A nonvolatile semiconductor memory comprising:
  at least one memory cell;
  two select gate transistors respectively connected to two terminals of said at least one memory cell, and
  a control circuit for supplying a first unselected potential to a bit line regardless of a state of said at least one memory cell when a program operation is started, and for supplying a second unselected potential or a selected potential to said bit line based on the state of said at least one memory cell during said program operation.

41. The memory according to claim 40, wherein said second unselected potential is higher than said first unselected potential.

* * * * *